(12) United States Patent
Ito

(10) Patent No.: US 11,581,265 B2
(45) Date of Patent: Feb. 14, 2023

(54) SEMICONDUCTOR DEVICE INCLUDING PAIRED MARKS AND METHOD FOR MANUFACTURING SEMICONDUCTOR DEVICE

(71) Applicant: Kioxia Corporation, Minato-ku (JP)

(72) Inventor: Takeshi Ito, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 449 days.

(21) Appl. No.: 16/811,026

(22) Filed: Mar. 6, 2020

(65) Prior Publication Data

US 2021/0074650 A1 Mar. 11, 2021

(30) Foreign Application Priority Data

Sep. 9, 2019 (JP) .............................. JP2019-163986

(51) Int. Cl.
| | | |
|---|---|---|
| *H01L 23/544* | (2006.01) | |
| *H01L 21/48* | (2006.01) | |
| *H01L 21/66* | (2006.01) | |
| *H01L 27/11565* | (2017.01) | |
| *H01L 27/1157* | (2017.01) | |

(52) U.S. Cl.
CPC ............ *H01L 23/544* (2013.01); *H01L 21/48* (2013.01); *H01L 22/12* (2013.01); *H01L 27/1157* (2013.01); *H01L 27/11565* (2013.01)

(58) Field of Classification Search
CPC ............. H01L 23/544; H01L 2223/544; H01L 2223/54426; H01L 2223/54453; H01L 2223/5446; H01L 27/115
See application file for complete search history.

(56) References Cited

U.S. PATENT DOCUMENTS

| | | | |
|---|---|---|---|
| 9,966,284 B2 | 5/2018 | Takakuwa | |
| 2008/0268350 A1* | 10/2008 | Yang ......................... | G03F 1/42 430/5 |
| 2017/0148656 A1* | 5/2017 | Takakuwa ........... | G03F 7/70141 |
| 2017/0154852 A1* | 6/2017 | Yasuda ............. | H01L 27/11582 |
| 2018/0233389 A1 | 8/2018 | Takakuwa | |

FOREIGN PATENT DOCUMENTS

| | | |
|---|---|---|
| JP | 2017-84837 A | 5/2017 |
| JP | 2017-97056 A | 6/2017 |

* cited by examiner

*Primary Examiner* — John P. Dulka
(74) *Attorney, Agent, or Firm* — Oblon, McClelland, Maier & Neustadt, L.L.P.

(57) ABSTRACT

A semiconductor device of an embodiment includes a plurality of chip regions, each including a memory region in which a plurality of memory cells is arranged, and a kerf region disposed between the chip regions and surrounding each chip region. Paired marks are arranged in a vicinity of the memory region of one of the plurality of chip regions and in a common hierarchical layer in the kerf region, and the paired marks are disposed over upper and lower hierarchical layers.

19 Claims, 18 Drawing Sheets

SEMICONDUCTOR DEVICE INCLUDING PAIRED MARKS AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2019-163986, filed on Sep. 9, 2019; the entire contents of which are incorporated herein by reference.

FIELD

Embodiments described herein relate generally to a semiconductor device and a method for manufacturing the semiconductor device.

BACKGROUND

A semiconductor device includes a stacked structure including, for example, a plurality of hierarchical layers. In a manufacturing process of the semiconductor device, a misalignment mark, for example, for inspecting misalignment between hierarchical layers is used. However, the position of the misalignment mark may sometimes be displaced due to stress in each layer of the semiconductor device, prohibiting accurate inspection of the misalignment between hierarchical layers.

DETAILED DESCRIPTION

A semiconductor device according to an embodiment includes a plurality of chip regions, each including a memory region in which a plurality of memory cells is arranged, and a kerf region disposed between the chip regions and surrounding each chip region. Paired marks are arranged in a vicinity of the memory region of one chip region of the plurality of chip regions and in a common hierarchical layer in the kerf region, the paired marks being disposed over upper and lower hierarchical layers.

Hereinafter, the present invention will be described in detail with reference to the accompanying drawings. The present invention is not limited by the following embodiments. Further, constituent components of the following embodiment include those that readily occur to those skilled in the art or those that are substantially equivalent to those of the embodiment.

(Example Configuration of Semiconductor Device)

Figure 1C:
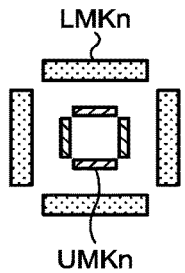
FIGS. 1A to 1D are plan views illustrating an example configuration of a semiconductor device according to an embodiment before being cut out into chips.
Figure 1D:
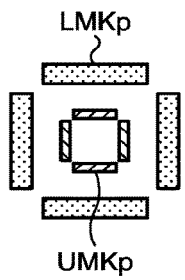
Figure 1B:
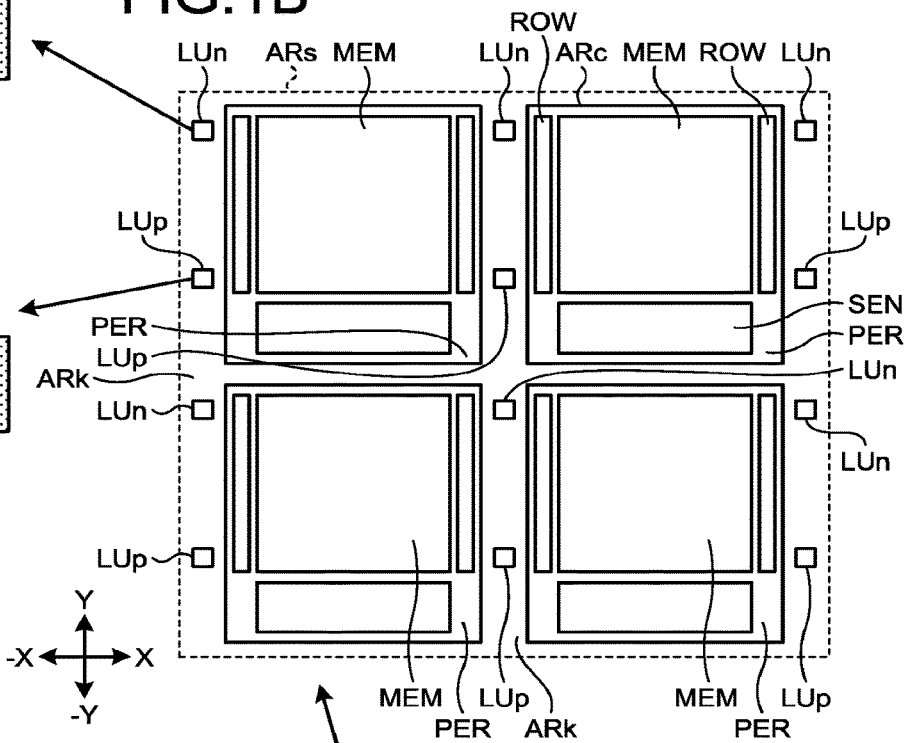
Figure 1A:
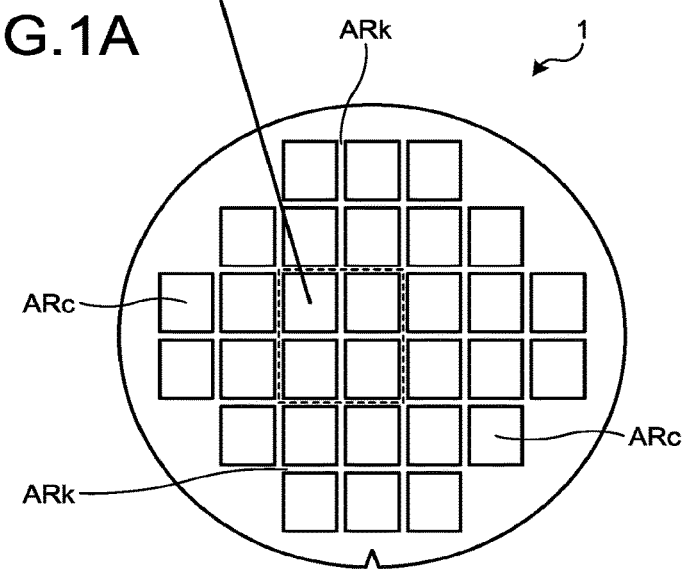

FIGS. 1A to 1D are plan views illustrating an example configuration of a semiconductor device 1 according to an embodiment before being cut out into chips. FIG. 1A is a plan view illustrating an overall configuration of the semiconductor device 1 before being cut out into chips. FIG. 1B is a plan view of a shot region ARs in which a plurality of chip regions ARc is arranged. FIG. 1C is an enlarged plan view illustrating a mark LUn provided in the semiconductor device 1. FIG. 1D is an enlarged plan view illustrating a mark LUp provided in the semiconductor device 1.

In the present specification, the vertical direction of the semiconductor device 1 is defined in accordance with a hierarchical layer on which marks LMKn and LMKp described later are arranged and a hierarchical layer on which marks UMKn and UMKp described later are arranged. That is, the vertical direction of the semiconductor device 1 is defined on the assumption that the hierarchical layer on which the marks LMKn and LMKp are arranged is lower than the hierarchical layer on which the marks UMKn and UMKp are arranged.

In the present specification, X-direction may be distinguished between +X-direction and −K-direction. When plus and minus are not distinguished, the X-direction is simply recited as X-direction. Similarly, Y-direction may be distinguished between +Y-direction and −Y-direction. When plus and minus are not distinguished, the Y-direction is simply recited as Y-direction.

As illustrated in FIG. 1A, before being cut into chips, the semiconductor device 1 includes a plurality of chip regions ARc and a kerf region ARk surrounding the chip regions ARc on a substrate such as a silicon wafer. The chip regions ARc are arranged in a grid, for example, with the kerf region ARk arranged therebetween. After being cut into chips, the semiconductor device 1 has a size substantially equal to the chip region ARc. When the semiconductor device 1 is cut into chips, the kerf region ARk is partially or entirely lost by dicing.

As illustrated in FIG. 1B, the shot region ARs is an area exposed by one-time lithography, and is defined as an area including a plurality of chip regions ARc.

The chip region ARc includes at least one memory portion MEM as a memory region and a peripheral region PER outside the memory portion MEM. The peripheral region PER includes a row decoder ROW as a peripheral circuit and a sense amplifier SEN as a peripheral circuit. In the example of FIG. 1B, the memory portion MEM is disposed in the center of the chip region ARc, and row decoders ROW are arranged on both sides of the memory portion MEM in the X-direction. Further, the sense amplifier SEN is arranged on one side of the memory portion MEM in the Y-direction, that is, in the −Y-direction.

A plurality of memory cells is arranged three-dimensionally in the memory portion MEM. That is, the semiconductor device 1 is a semiconductor storage device configured, for example, as a three-dimensional nonvolatile memory. Word lines are in a stacked structure and connected to the memory cells, with the word lines being led stepwise from the end portions of the memory portion MEM on both of the row decoder ROW sides (X-direction and −X-direction) and connected to the row decoder ROW and the like.

The row decoders ROW and the sense amplifier SEN contribute to the operation of the memory cells. The row decoders ROW specify a region including the memory cells to be operated. The sense amplifier SEN senses data held in the memory cells.

The kerf region ARk includes a plurality of marks LUn and LUp on the same hierarchical layer of the semiconductor device 1. Among the plurality of marks LUn and LUp, the marks LUn and LUp which are arranged, for example, on the +X-direction side or the −X-direction side of one memory portion MEM are paired.

The mark LUn is arranged on the +Y-direction side with respect to the paired mark LUp. The mark LUp is arranged on the −Y-direction side with respect to the paired mark LUn. More specifically, the marks LUn and LUp are arranged at positions that are, for example, line-symmetric in the Y-direction with respect to the center position of the memory portion MEM.

Thus, the paired marks LUn and LUp of the plurality of marks LUn and LUp are arranged in a vicinity of the same memory portion MEM, are line-symmetric, for example, in the Y-direction with respect to the center position of the memory portion MEM, and can preferably be identified as having the same kind of shape.

As illustrated in FIG. 1C, the mark LUn includes marks LMKn and UMKn. The marks LMKn and UMKn are arranged on different hierarchical layers of the semiconductor device 1. The mark LMKn is arranged on a lower hierarchical layer below the mark UMKn. The mark UMKn is arranged on an upper hierarchical layer above the mark LMKn.

As illustrated in FIG. 1D, the mark LUp is configured similarly to, for example, the mark LUn. That is, the mark LUp includes marks LMKp and UMKp. The marks LMKp and UMKp are arranged on different hierarchical layers of the semiconductor device 1. The mark LMKp is arranged on, for example, the same hierarchical layer as the mark LMKn. The mark UMKp is arranged on, for example, the same hierarchical layer as the mark UMKn.

Here, among the marks LMKn, UMKn, LMKp, and UMKp constituting the paired marks LUn and LUp, those arranged on the same hierarchical layer can be extracted and regarded as a pair.

That is, the marks LMKn and LMKp arranged on the same hierarchical layer are paired. Thus, among the plurality of marks LMKn, UMKn, LMKp, and UMKp, the paired marks LMKn and LMKp are arranged in the vicinity of the same memory portion MEM, as described above, are line-symmetric, for example, in the Y-direction with respect to the center position of the memory portion MEM, and can preferably be identified as having the same kind of shape and arranged on the same hierarchical layer.

Further, the marks UMKn and UMKp arranged on the same hierarchical layer are paired. Thus, among the plurality of marks LMKn, UMKn, LMKp, and UMKp, the paired marks UMKn and UMKp are arranged in the vicinity of the same memory portion MEM, as described above, are line-symmetric, for example, in the Y-direction with respect to the center position of the memory portion MEM, and can preferably be identified as having the same kind of shape and arranged on the same hierarchical layer.

Further, in terms of the marks LMKn and LMKp arranged on the same hierarchical layer and the marks UMKn and UMKp arranged on the same hierarchical layer, the marks LMKn and LMKp and the marks UMKn and UMKp are arranged over the upper and lower hierarchical layers by at least partly overlapping with each other in a top view.

Figure 2A:
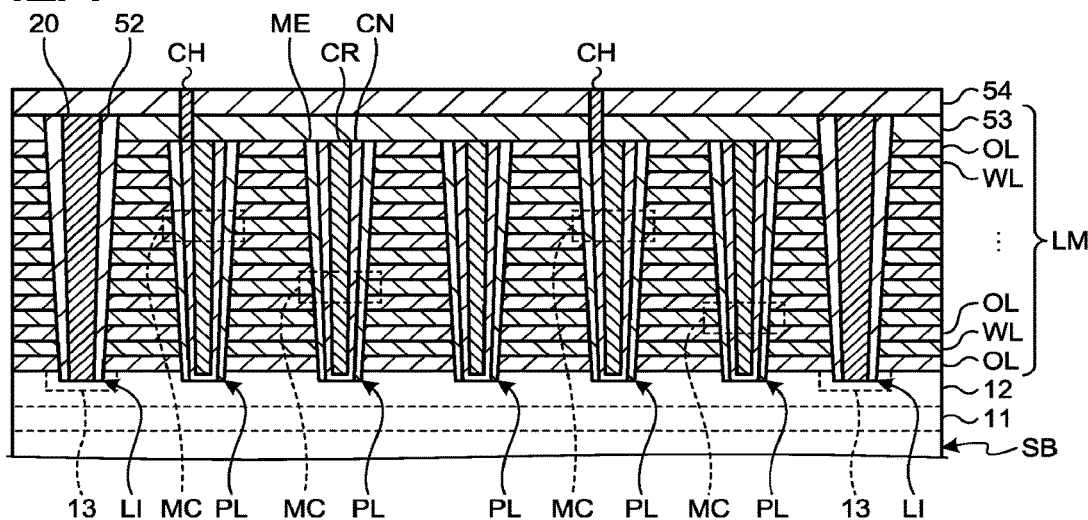
FIGS. 2A to 2C are cross-sectional views illustrating an example configuration of the semiconductor device according to the embodiment.
Figure 2B:
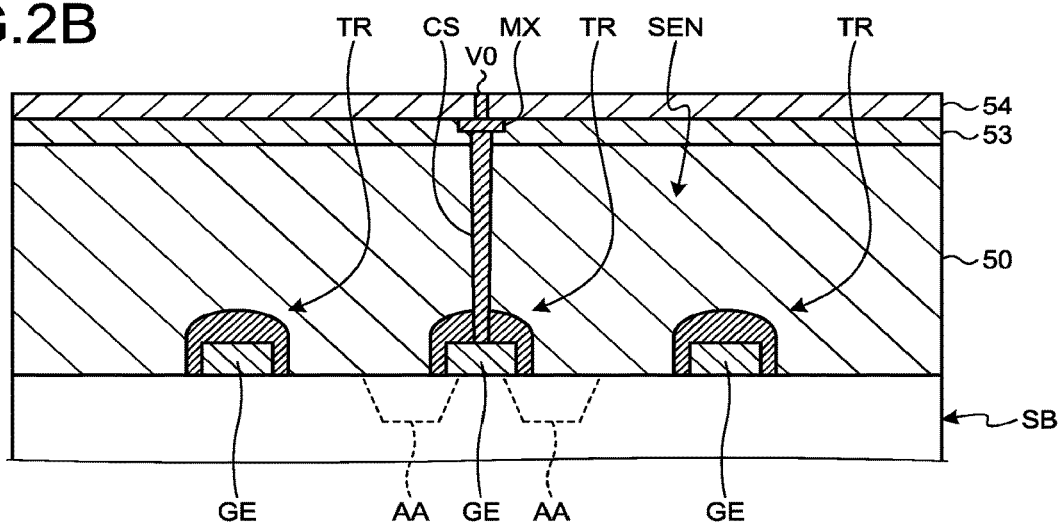
Figure 2C:
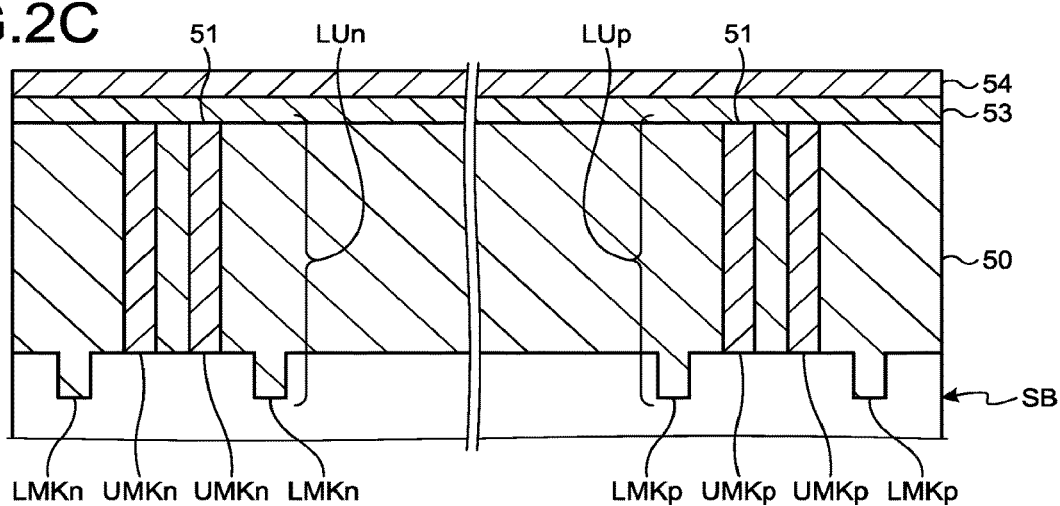

FIGS. 2A to 2C are cross-sectional views illustrating an example configuration of the semiconductor device 1 according to the embodiment. FIG. 2A is a cross-sectional view of the memory portion MEM in the Y-direction in the semiconductor device 1. FIG. 2B is a cross-sectional view of the peripheral circuit in the Y-direction on the sense amplifier SEN side of the semiconductor device 1. The peripheral circuit on the row decoder ROW side has a similar configuration as the peripheral circuit on the sense amplifier SEN side. FIG. 2C is a cross-sectional view of paired marks LUn and LUp in the Y-direction in the semiconductor device 1. Note that the scale of individual constituent components is not always as illustrated in FIGS. 2A to 2C.

As illustrated in FIG. 2A, the semiconductor device 1 includes a substrate SB such as a silicon substrate. In the memory portion MEM, an n-well 11 is formed in the surface layer of the substrate SB, a p-well 12 is formed in the n-well 11, and a plurality of n$^+$-diffusion areas 13 is formed in the p-well 12.

On the substrate SB, a stacked body LM including alternately stacked word lines WL, which serve as conductive layers, and insulating layers OL is disposed. The word lines WL are formed of, for example, tungsten layers or molybdenum layers. The insulating layers OL are formed of, for example, SiO$_2$ layers.

Although the stacked body LM includes seven-layered word lines WL in the example of FIG. 2A, any number of word lines WL may be stacked. Further, the stacked body LM may be configured with a selection gate line (not illustrated) disposed under the lowermost word line WL, or a selection gate line (not illustrated) disposed over the uppermost word line WL.

A plurality of contacts LI penetrating through the stacked body LM and an insulating layer 53 over the stacked body LM and dividing the stacked body LM in the Y-direction is arranged on the $n^+$-diffusion area 13 of the substrate SB. Each contact LI has an insulating layer 52 that covers the sidewall of the contact LI. A conductive layer 20 is provided to fill inside the insulating layer 52 of the contact LI. The insulating layer 52 is, for example, a $SiO_2$ layer. The conductive layer 20 is, for example, a polysilicon layer or a tungsten layer.

Thus, the contact LI having the conductive layer 20 is disposed on the $n^+$-diffusion area 13 of the substrate SB, so that the contact LI can function as, for example, a source line contact.

The stacked body LM between the two contacts LI includes a plurality of pillars PL arranged in a matrix. Each pillar PL penetrates through the stacked body LM and reaches the p-well 12 of the substrate SB.

Each pillar PL includes a memory layer ME, a channel layer CN, and a core layer CR in order from the outer peripheral side of the pillar PL. The channel layer CN is also disposed at the bottom of the pillar PL. The memory layer ME is a layer in which, for example, $SiO_2$ layer/SiN layer/$SiO_2$ layer are stacked, the channel layer CN is, for example, an amorphous silicon layer or a polysilicon layer, and the core layer CR is, for example, a $SiO_2$ layer.

The insulating layer 53 is disposed on the stacked body LM. An insulating layer 54 is disposed on the insulating layer 53. The channel layer CN of each pillar PL is connected to an upper wiring layer such as a bit line by a plug CH penetrating through the insulating layers 53 and 54. The conductive layer 20 of each contact LI is connected to the upper wiring layer by a plug (not illustrated) penetrating through the insulating layer 54.

With the configuration described above, memory cells MC are formed at the intersections between the individual pillars PL and the individual word lines WL. Each memory cell MC may hold the electric charge, when a predetermined voltage is applied from the word line WL, to write data in the memory cell MC. The data is read from the memory cell MC to the bit line when a predetermined voltage is applied from the word line WL.

As illustrated in FIG. 2B, the sense amplifier SEN includes a plurality of transistors TR. Each transistor TR includes a gate electrode GE and active areas AA formed on both sides of the gate electrode GE in the substrate SB. Note that the n-well and/or the p-well (not illustrated) may be disposed in the surface layer of the substrate SB in the peripheral region PER. The peripheral region PER including the transistors TR is covered with an insulating layer 50 having a height, for example, approximately equal to the height of the upper surface of the stacked body LM in FIG. 2A. In other words, the insulating layer 50 is disposed on the same hierarchical layer as the stacked body LM where the pillars PL are disposed.

The contact CS is connected to the gate electrode GE of the transistor TR through the insulating layer 50 covering the sense amplifier SEN. The upper end portion of the contact CS is connected to a wiring layer MX disposed in the insulating layer 53 covering the insulating layer 50. Note that another contact (not illustrated) may also be connected to the active area AA of the transistor TR through the insulating layer 50.

The insulating layer 53 is disposed on the insulating layer 50 covering the peripheral region PER. An insulating layer 54 is disposed on the insulating layer 53. The wiring layer MX in the insulating layer 53 is connected to the upper wiring layer by the plug V0 penetrating through the insulating layer 54.

As illustrated in FIG. 2C, the marks LMKn and LMKp are configured as, for example, concave portions on the surface layer of the substrate SB. In the kerf region ARk, the marks LMKn and LMKp are also covered with the insulating layer 50 having the height approximately equal to, for example, the height of the upper surface of the stacked body LM in FIG. 2A. In other words, the insulating layer 50 is disposed on the same hierarchical layer as the stacked body LM where the pillars PL are disposed.

The mark UMKn penetrates through the insulating layer 50 and reaches the substrate SB surrounded by the marks LMKn. The mark UMKp penetrates through the insulating layer 50 and reaches the substrate SB surrounded by the marks LMKp. The marks UMKn and UMKp are formed of, for example, insulating layers 51. Alternatively, some or all of the marks UMKn and UMKp may be made of the same material as that of, for example, the pillars PL.

In the kerf region ARk, the insulating layer 53, for example, is also disposed on the insulating layer 50 where the marks UMKn and UMKp are disposed. The insulating layer 54, for example, is disposed on the insulating layer 53.

(Method for Manufacturing Semiconductor Device)

Next, an example of a method for manufacturing the semiconductor device 1 of the embodiment is described with reference to FIGS. 3A to 14C.

FIGS. 3A to 12C are cross-sectional views illustrating an example procedure of the method for manufacturing the semiconductor device 1 according to the embodiment. Letters A, B, and C of the same figure number indicate different sites in the same processing step. In FIGS. 3A to 12C, A corresponds to the site illustrated in FIGS. 2A, B corresponds to the site illustrated in FIGS. 2B, and C corresponds to the site illustrated in FIG. 2C.

Figure 3A:
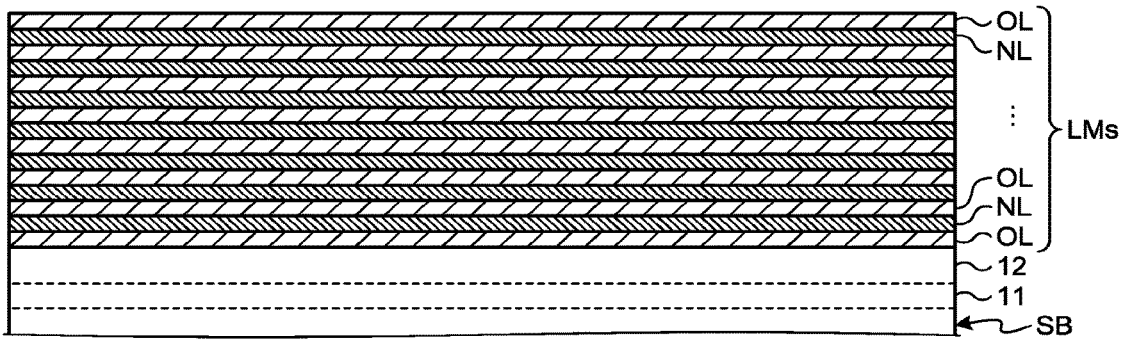
FIGS. 3A to 3C are cross-sectional views illustrating an example procedure of a method for manufacturing the semiconductor device according to the embodiment.
Figure 3B:
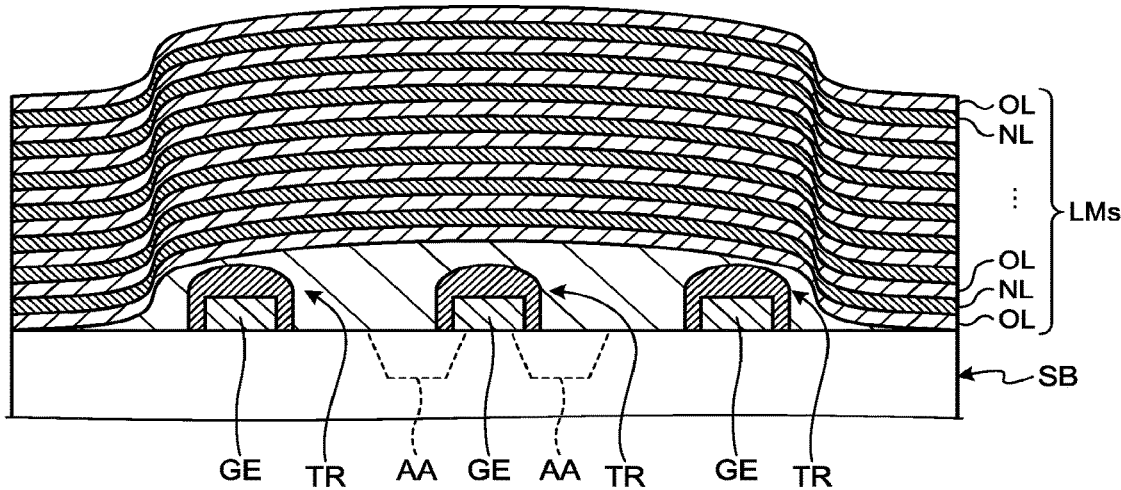

As illustrated in FIG. 3B, the transistors TR including the active areas AA and the gate electrodes GE, and the like are formed on the substrate SB. The substrate SB includes the n-well 11, the p-well 12, and the like in its surface layer portion as illustrated in FIG. 3A.

Figure 3C:
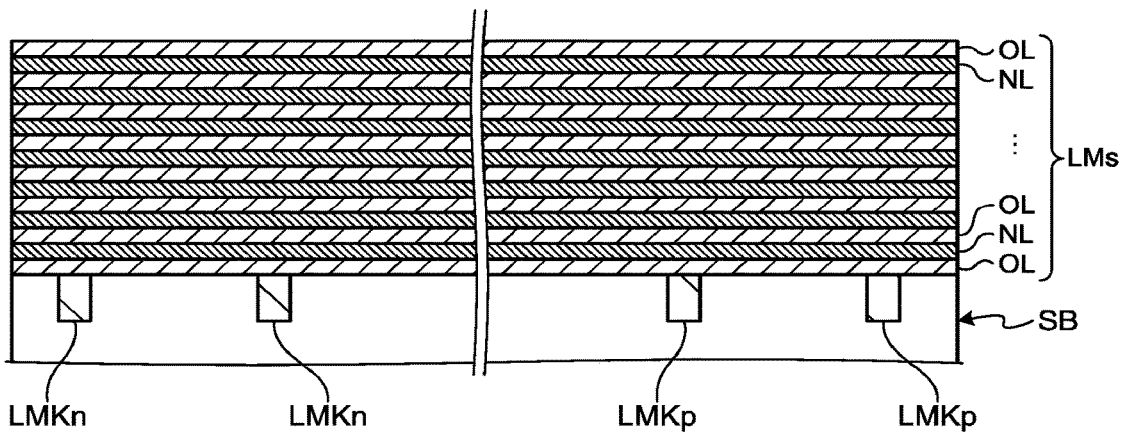

As illustrated in FIG. 3C, the marks LMKn and LMKp are formed on the surface layer of the substrate SB in parallel with the processing for forming the transistors TR and the like. That is, the marks LMKn and LMKp are formed on the same hierarchical layer as the transistors TR, and substantially no misalignment occurs between the marks LMKn and LMKp and the transistors TR.

As illustrated in FIGS. 3A to 3C, a stacked body LMs including sacrificial layers NL and insulating layers OL stacked alternately is formed on the substrate SB including the transistors TR, the marks LMKn and LMKp, and the like in its surface layer portion. The sacrificial layer NL is an insulating layer, such as a SiN layer, which is later replaced by a conductive material to become the word line WL.

Figure 4A:
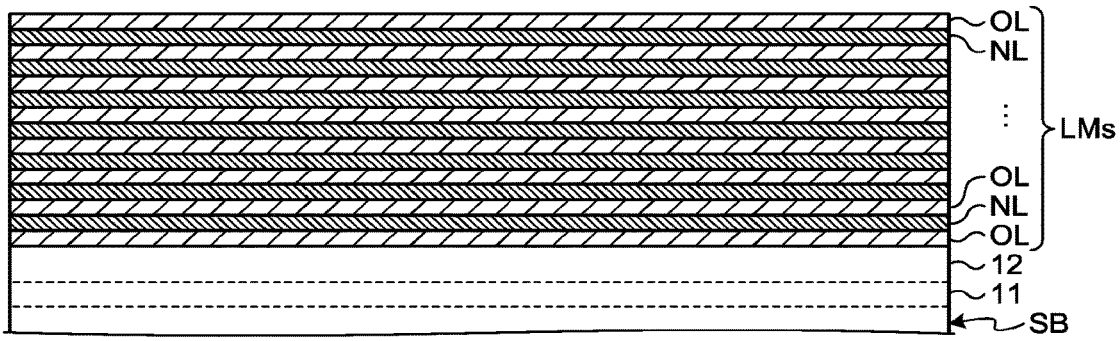
FIGS. 4A to 4C are cross-sectional views illustrating an example procedure of the method for manufacturing the semiconductor device according to the embodiment.
Figure 4B:
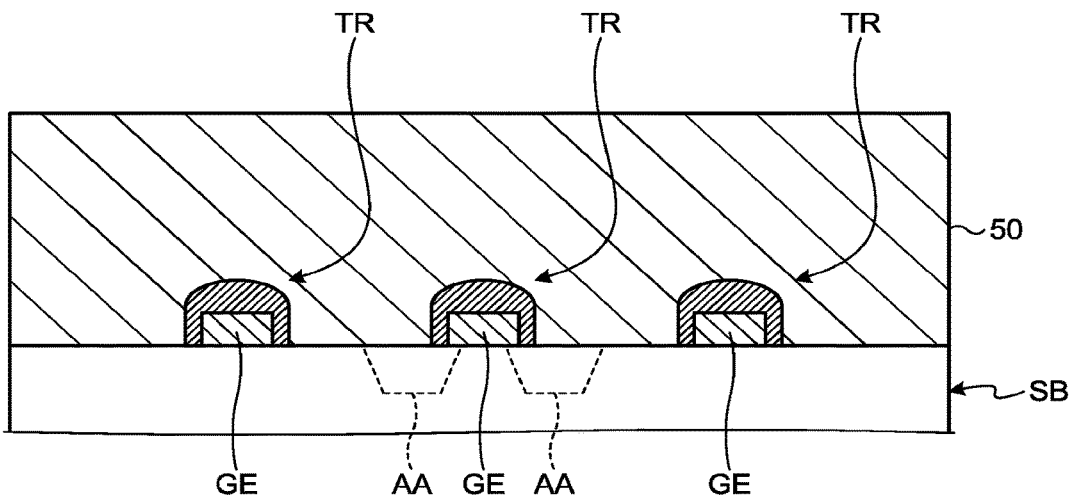
Figure 4C:
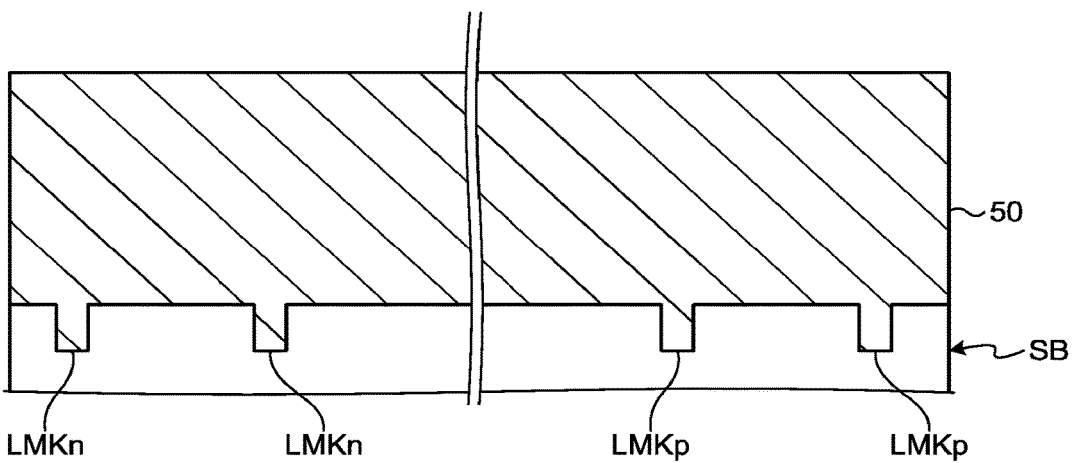

As illustrated in FIGS. 4B and 4C, the stacked body LMs is entirely removed from the substrate SB in the peripheral region PER where the sense amplifier SEN is formed and in the region where the marks LUn and LUp are formed.

In the peripheral region PER where the sense amplifier SEN is formed, the transistors TR are entirely covered with the insulating layer 50 up to the height of the upper surface of the stacked body LMs. In the region where the marks LUn and LUp are formed, the entire region including the marks LMKn and LMKp is also covered with the insulating layer 50 up to the height of the upper surface of the stacked body LMs.

At this time, a step-like structure is formed at the end portion of the stacked body LMs of FIG. 4A that remains without being removed, although not illustrated in FIGS. 4A to 4C.

Figure 5A:
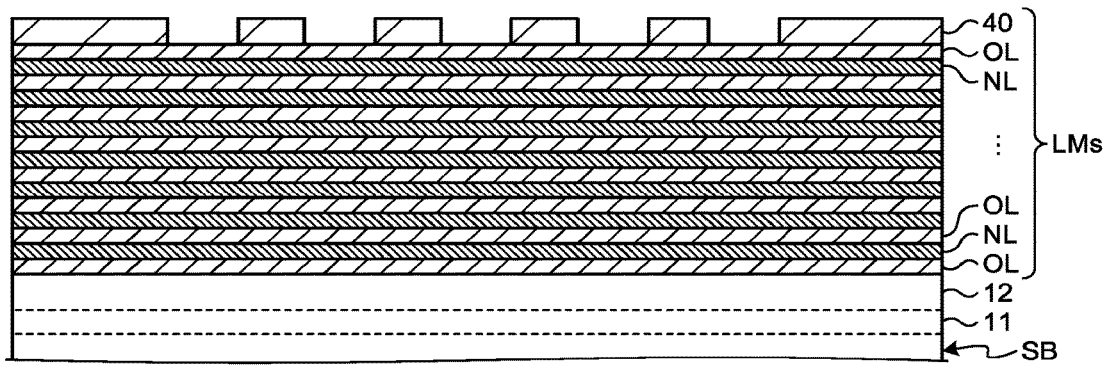
FIGS. 5A to 5C are cross-sectional views illustrating an example procedure of the method for manufacturing the semiconductor device according to the embodiment.
Figure 5B:
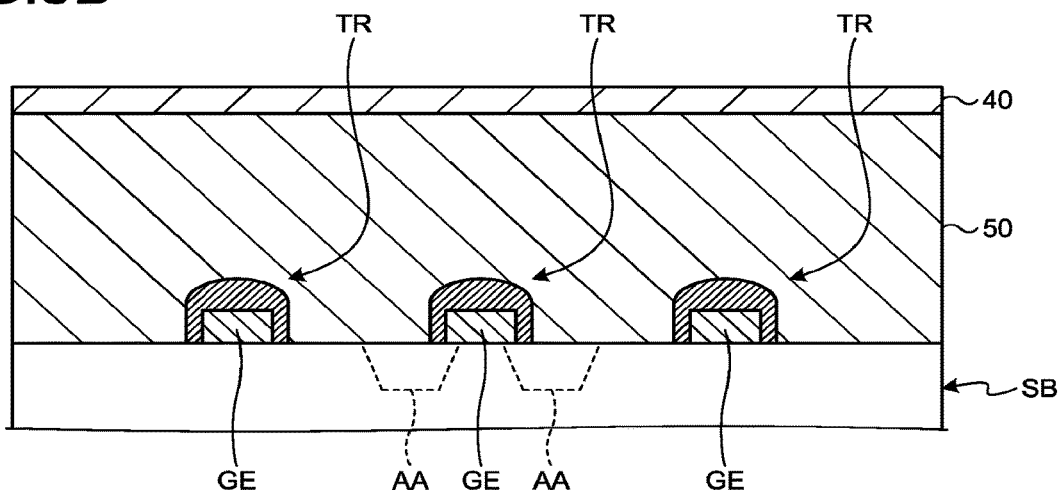
Figure 5C:
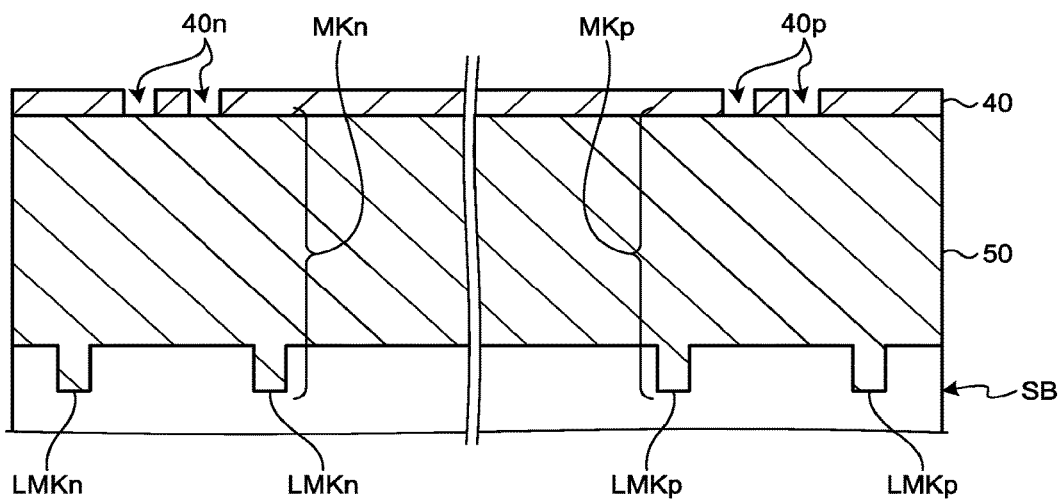

As illustrated in FIGS. 5A to 5C, a resist pattern 40 is formed as a mask pattern over the upper surfaces of individual components.

As illustrated in FIG. 5A, the resist pattern 40 is formed on the entire surface of the stacked body LMs, except for portions where the pillars PL are formed, in the region where the memory portion MEM is formed.

As illustrated in FIG. 5B, the resist pattern 40 is formed on the entire surface of the insulating layer 50 covering the peripheral region PER.

As illustrated in FIG. 5C, the resist pattern 40 is formed on the insulating layer 50. The resist pattern 40 includes marks 40n and 40p as misalignment marks on the insulating layer 50.

The mark 40n has a pattern similar to the pattern of the above-described mark UMKn in a top view, and is used for misalignment inspection when observed with an optical microscope or the like in an overlapping manner with the mark LMKn described above. A mark MKn is formed of the mark 40n and the mark LMKn.

The mark 40p has a pattern similar to the pattern of the above-described mark UMKp in a top view, and is used for misalignment inspection when observed with the optical microscope or the like in an overlapping manner with the mark LMKp described above. A mark MKp is formed of the mark 40p and the mark LMKp.

The marks 40n and 40p are paired and, in the misalignment inspection, the mark MKn formed of the marks 40n and LMKn and the mark MKp formed of the marks 40p and LMKp are used in combination. Details of the misalignment inspection method using the marks MKn and MKp will be described later.

Figure 6A:
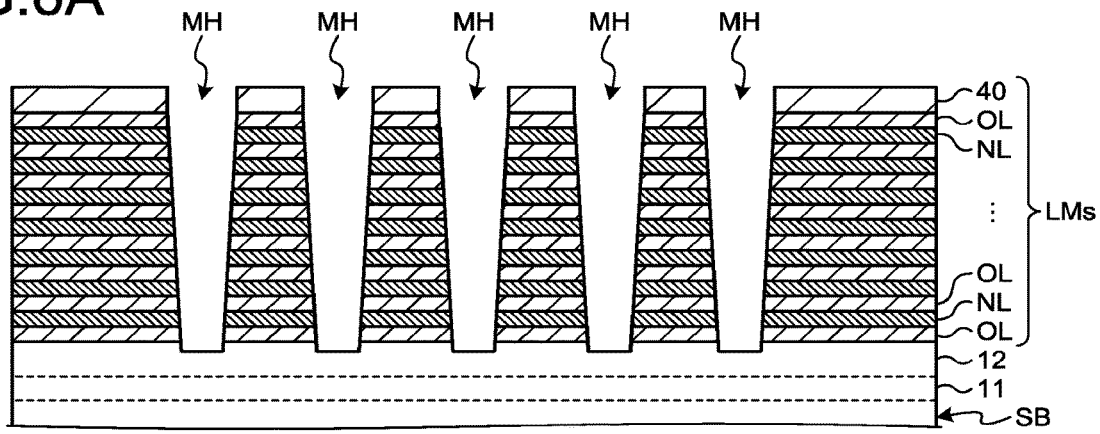
FIGS. 6A to 6C are cross-sectional views illustrating an example procedure of the method for manufacturing the semiconductor device according to the embodiment.
Figure 6B:
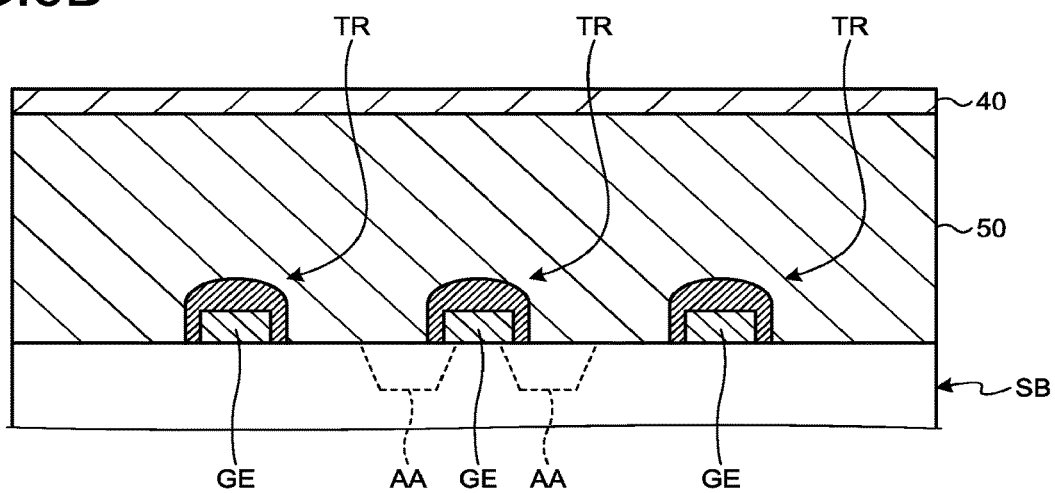

As illustrated in FIG. 6A, a plurality of memory holes MH penetrating through the stacked body LMs and reaching the p-well 12 of the substrate SB are formed with the resist pattern 40 used as the mask.

Figure 6C:
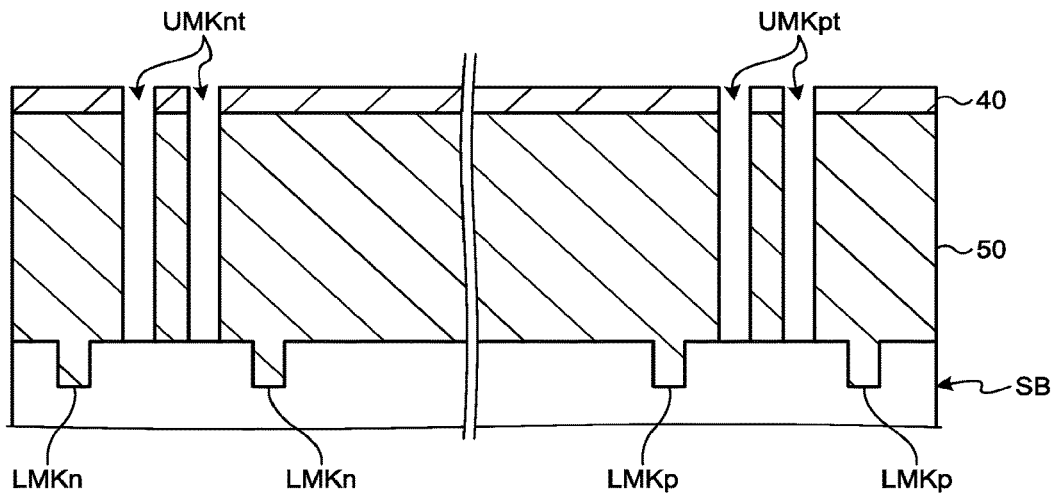

As illustrated in FIG. 6C, in parallel with the processing of forming the memory holes MH, a plurality of grooves UMKnt and UMKpt penetrating through the insulating layer 50 and reaching the substrate SB is formed with the resist pattern 40 used as a mask.

Figure 7A:
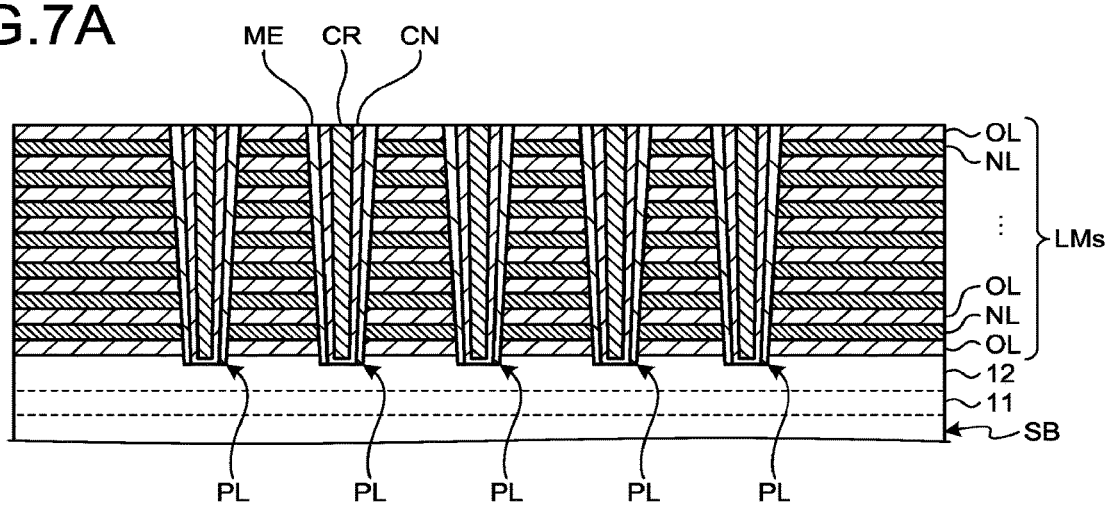
FIGS. 7A to 7C are cross-sectional views illustrating an example procedure of the method for manufacturing the semiconductor device according to the embodiment.
Figure 7B:
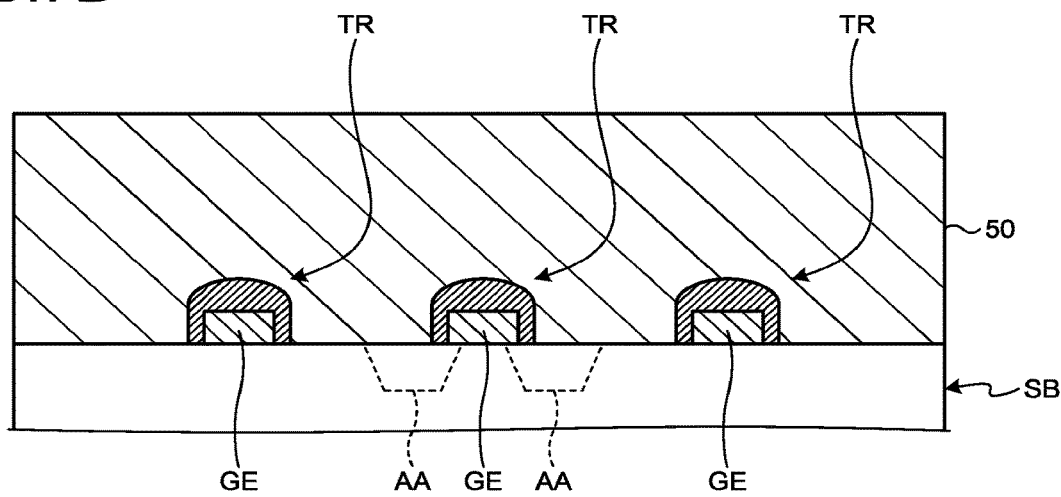

As illustrated in FIG. 7A, the plurality of pillars PL is formed in the stacked body LMs. That is, each memory hole MH is filled with a memory layer ME in which $SiO_2$ layer/SiN layer/$SiO_2$ layer are stacked, a channel layer CN such as an amorphous silicon layer or a polysilicon layer, and a core layer CR such as an $SiO_2$ layer in order from the sidewall side of the memory hole MH. The channel layer CN is also formed on the bottom surface of the memory hole MH.

Figure 7C:
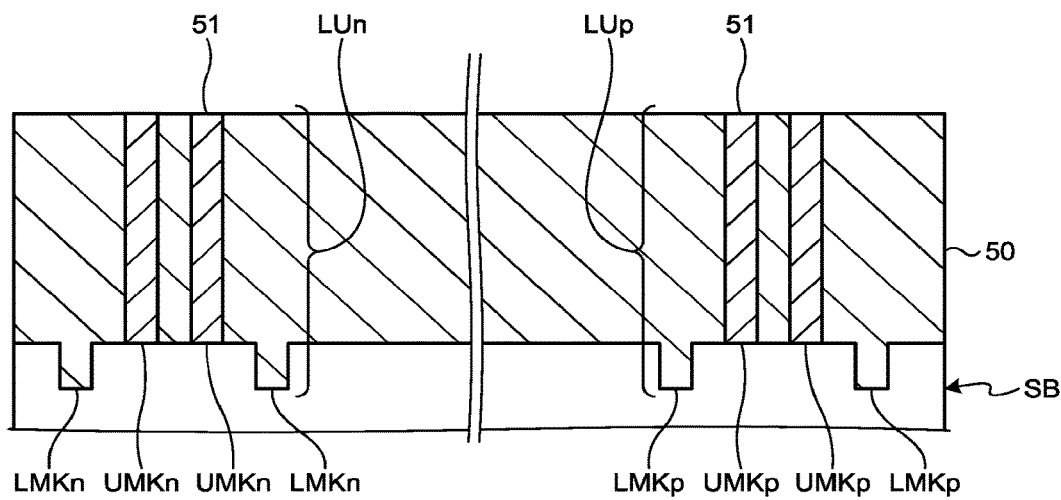

As illustrated in FIG. 7C, the grooves UMKnt and UMKpt are filled with the insulating layer 51 to form the marks UMKn and UMKp. Alternatively, the marks UMKn and UMKp may partly or entirely be made of the same materials as the materials of the pillars PL by filling the grooves UMKnt and UMKpt with the same materials in parallel with filling the memory holes MH with various materials.

Thus, the pillars PL and the marks UMKn and UMKp are formed on the same hierarchical layer. Further, the pillars PL and the marks UMKn and UMKp are formed using the same resist pattern 40 by one-time lithography, so that substantially no misalignment can occur between these components.

Figure 8A:
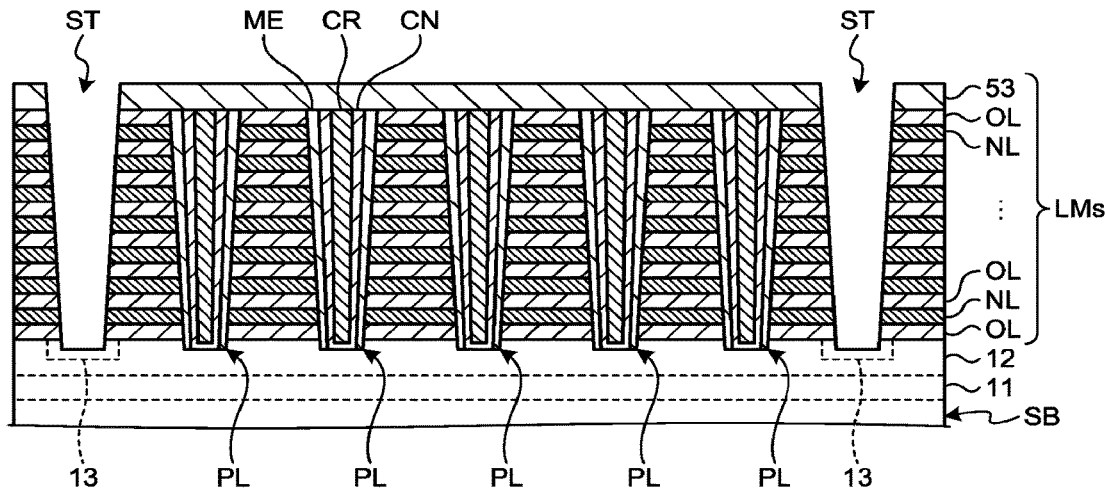
FIGS. 8A to 8C are cross-sectional views illustrating an example procedure of the method for manufacturing the semiconductor device according to the embodiment.
Figure 8B:
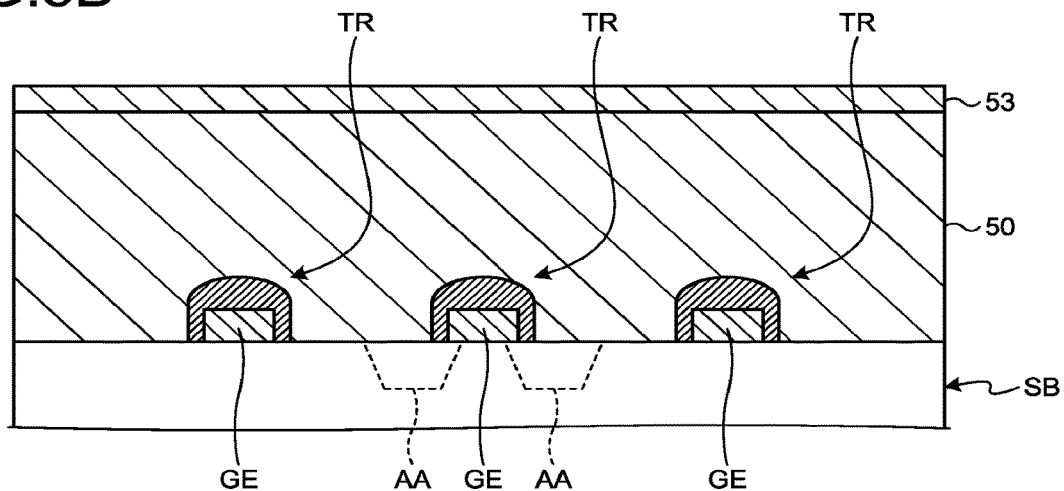
Figure 8C:
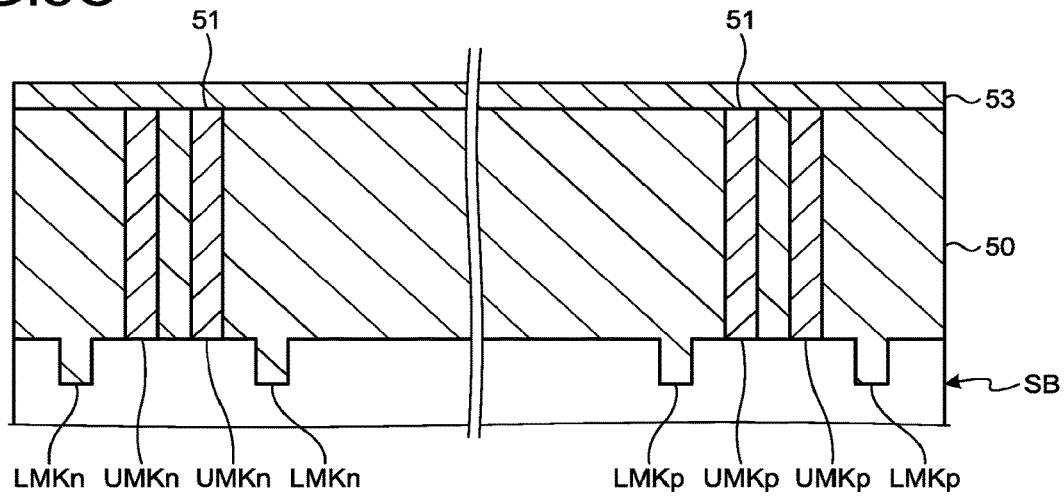

As illustrated in FIGS. 8A to 8C, the insulating layer 53 is formed over the upper layers of individual components.

As illustrated in FIG. 8A, slits ST penetrating through the insulating layer 53 and the stacked body LMs and reaching the substrate SB are formed. Further, the $n^+$-diffusion areas 13 are formed in the surface layer portion of the substrate SB through the slits ST penetrating through the stacked body LMs.

Figure 9A:
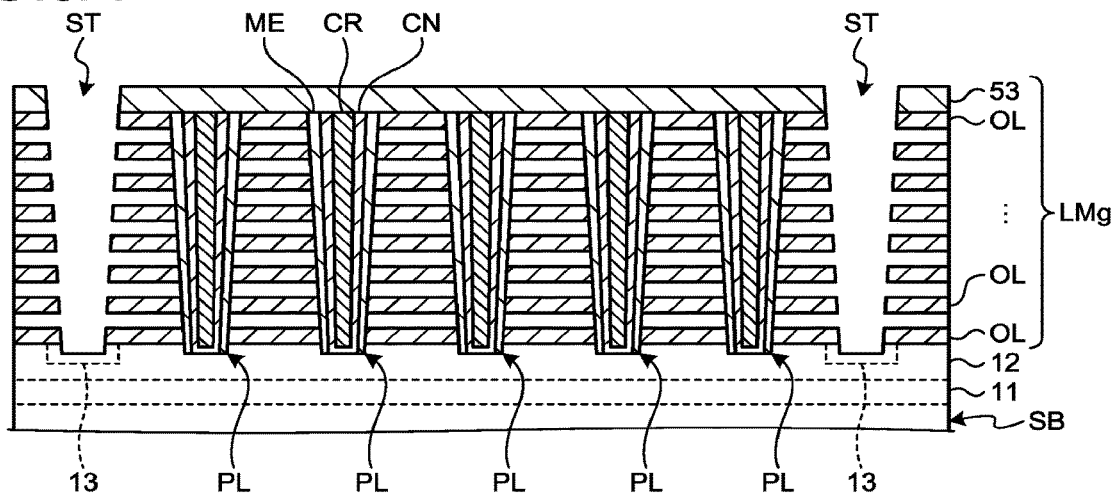
FIGS. 9A to 9C are cross-sectional views illustrating an example procedure of the method for manufacturing the semiconductor device according to the embodiment.
Figure 9B:
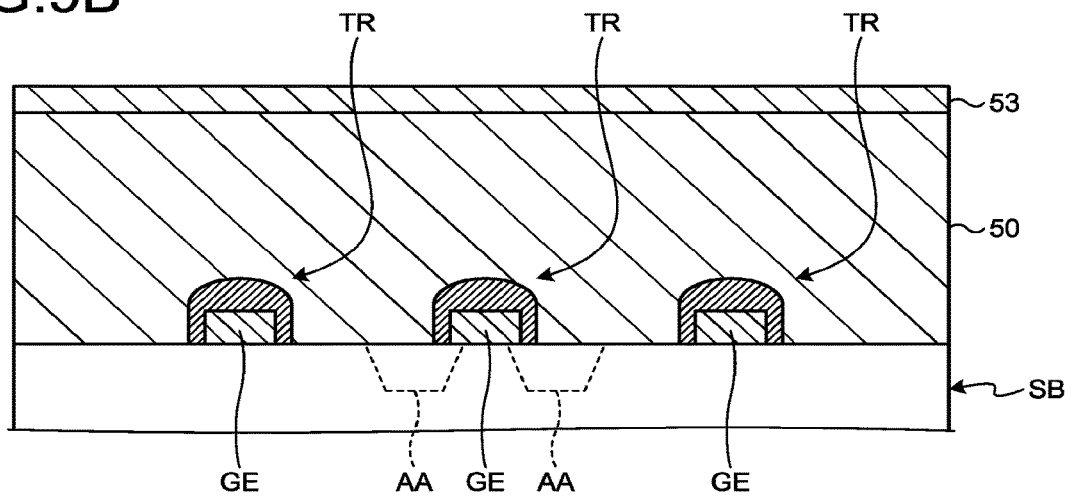
Figure 9C:
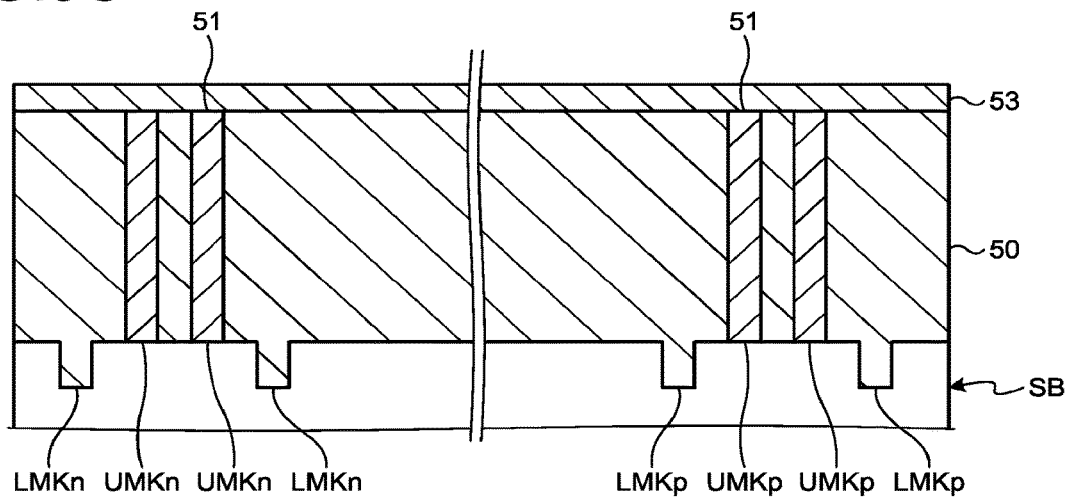

As illustrated in FIG. 9A, the sacrificial layers NL in the stacked body LMs are removed through the slits ST penetrating through the stacked body LMs. Thus, a stacked body LMg with gaps formed between the insulating layers OL is formed.

Figure 10A:
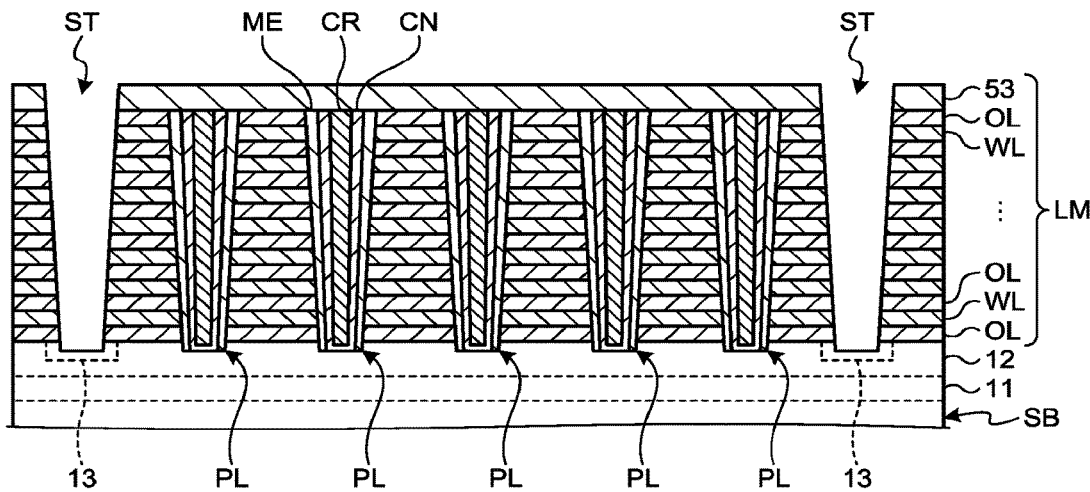
FIGS. 10A to 10C are cross-sectional views illustrating an example procedure of the method for manufacturing the semiconductor device according to the embodiment.
Figure 10B:
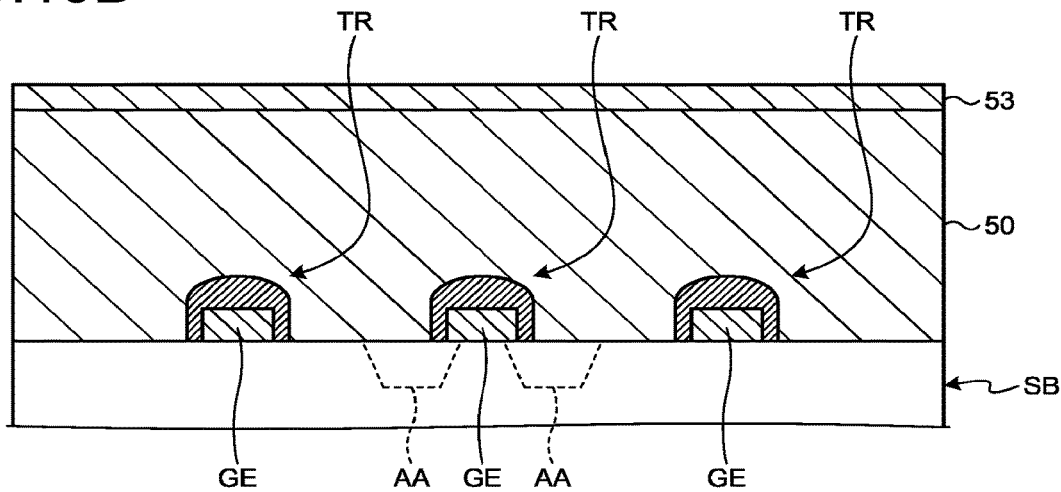
Figure 10C:
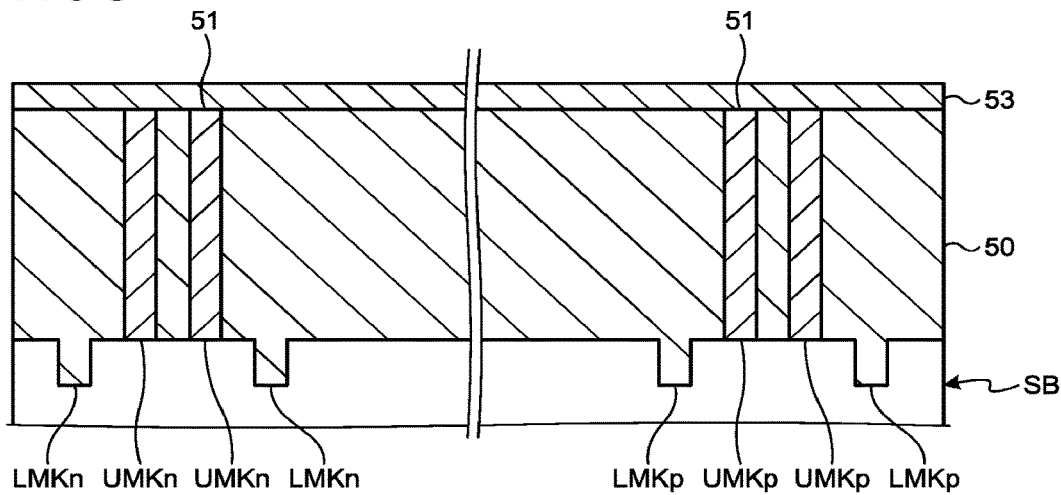

As illustrated in FIG. 10A, the gaps in the stacked body LMg are filled with a conductive material through the slits ST penetrating through the stacked body LMg. Thus, the stacked body LM with the word lines WL disposed between the insulating layers OL is formed.

As illustrated in FIGS. 9A and 10A, replacing the sacrificial layers NL with the word lines WL may be referred to as replacement.

Figure 11A:
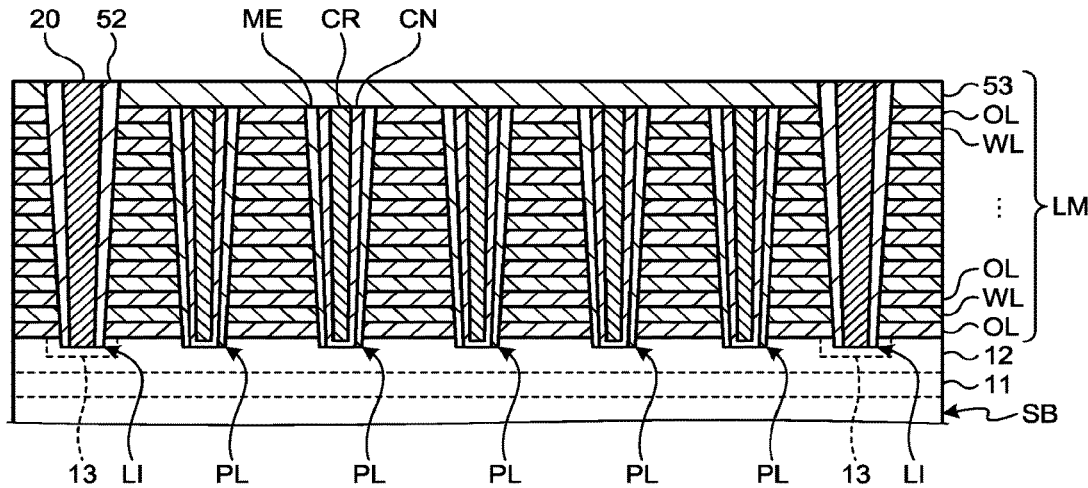
FIGS. 11A to 11C are cross-sectional views illustrating an example procedure of the method for manufacturing the semiconductor device according to the embodiment.
Figure 11B:
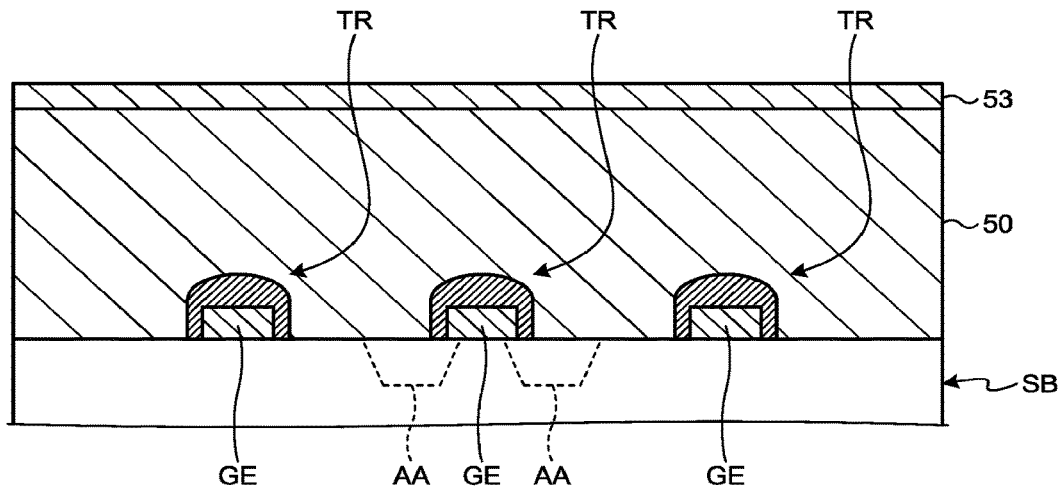
Figure 11C:
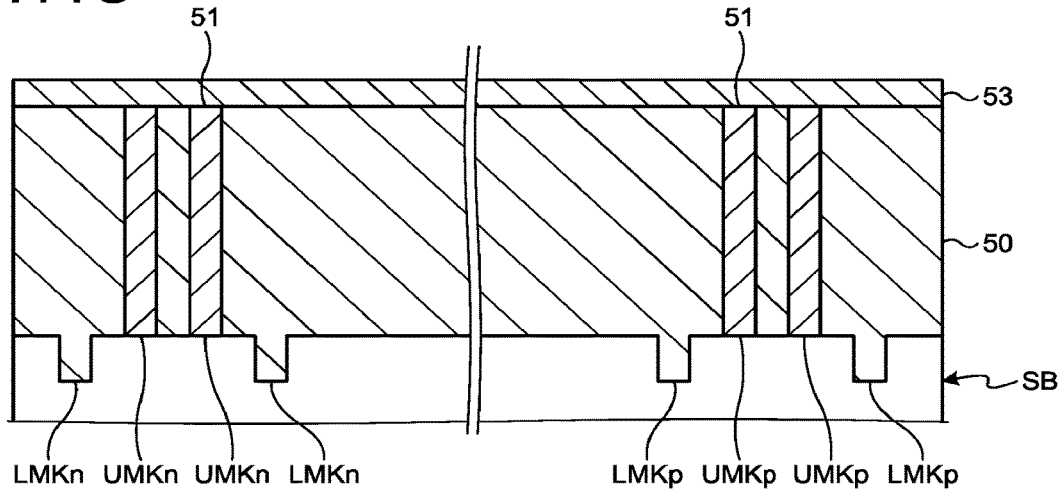

As illustrated in FIG. 11A, the insulating layer 52 is formed on the sidewall of each slit ST. The inside of the insulating layer 52 is filled with the conductive layer 20. As a result, the contact LI connected to the $n^+$-diffusion area 13 is formed.

Figure 12A:
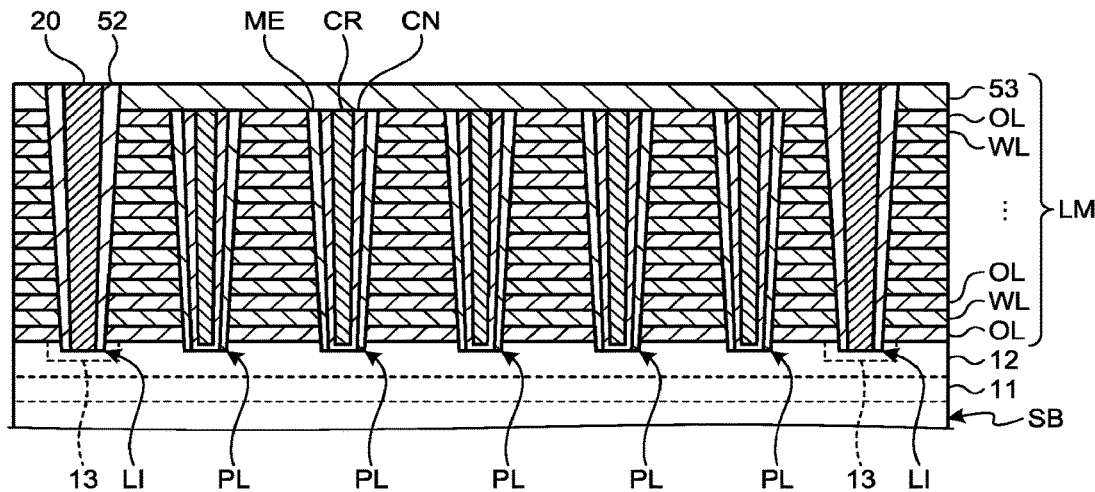
FIGS. 12A to 12C are cross-sectional views illustrating an example procedure of the method for manufacturing the semiconductor device according to the embodiment.
Figure 12B:
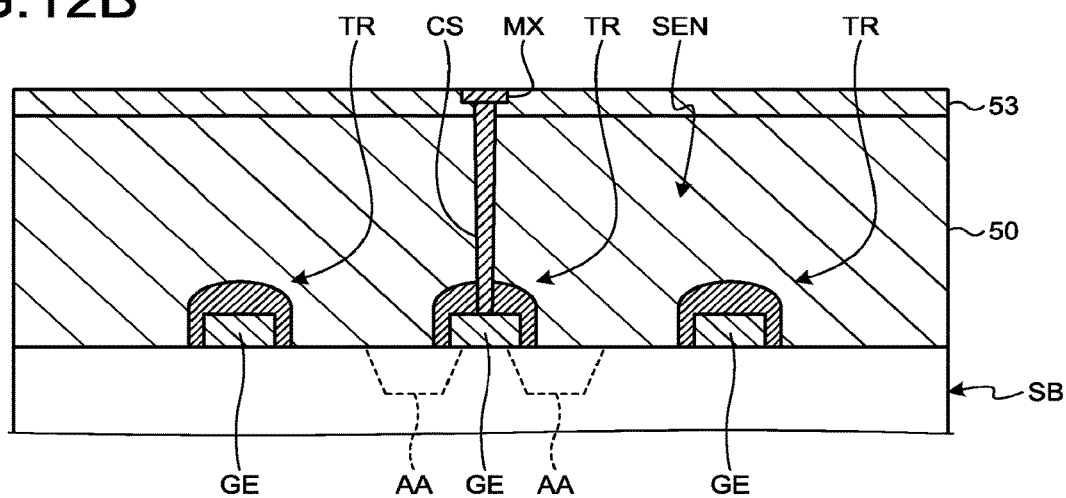
Figure 12C:
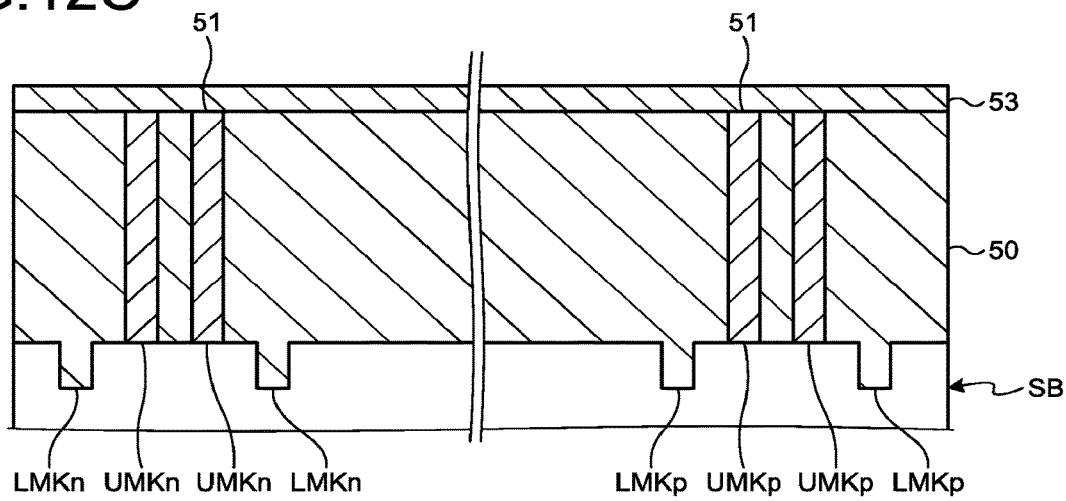

As illustrated in FIG. 12B, the contact CS penetrating through the insulating layer 50 and reaching the gate electrode GE of the transistor TR, and the wiring layer MX connected to the upper end portion of the contact CS is formed. At this time, another contact (not illustrated) may also be formed to penetrate through the insulating layer 50 and reach the active area AA of the transistor TR.

After that, the insulating layer 54 is formed on the insulating layer 53. The plurality of plugs V0 penetrating through the insulating layer 54 is formed, and each plug V0 is connected to the conductive layer 20 of the contact LI or the wiring layer MX on the contact CS. The plurality of plugs CH penetrating through the insulating layers 54 and 53 is formed, and each plug CH is connected to the channel CN of each pillar PL.

The semiconductor device 1 of the embodiment is manufactured as described above.

In the misalignment inspection using the marks MKn and MKp in FIG. 5C, positions of arranging the marks 40n and 40p included in the resist pattern 40 are determined according to a predetermined procedure. The positions of arranging the marks LMKn and LMKp on the substrate SB or the like depend on the positions of arranging the marks 40n and 40p. That is, first, the positions of arranging the paired marks 40n and 40p are determined, and then, on the basis of the determined positions, the marks LMKn and LMKp are arranged in advance at positions overlapping the marks 40n and 40p in a top view.

To determine the positions of arranging the paired marks 40n and 40p, it is assumed that a stress distribution in the shot region ARs at the steps of FIGS. 4A to 4C is already known.

The stress distribution in the shot region ARs can be calculated from, for example, the amount of surface strain of the individual portions in the shot region ARs illustrated in FIGS. 4A to 4C. The surface strain of the individual portions is caused by the stress in the shot region ARs, and it is estimated that the amount of strain on the surface of each portion corresponds to a magnitude of the stress. The amount of strain on the surface of the individual portions can be measured by a strain amount measuring device using laser light or the like.

Further, the stress distribution in the shot region ARs may be calculated from a stress simulation. In the stress simulation, the stress distribution in the shot region ARs can be calculated by simulation according to the physical properties of materials such as materials of the peripheral region PER including the row decoders ROW, the sense amplifier SEN, and the like, and a material of the memory portion MEM, and the like.

For example, by measuring the amount of strain on the surface of each portion of one to a plurality of substrates SB in advance, followed by calculating the stress distribution from each strain amount, and using its average value or the like as a representative value, the positions of arranging the marks 40*n* and 40*p* can be determined in advance.

FIGS. 13A to 13D are schematic views for explaining the procedure for determining the positions of arranging the marks 40*n* and 40*p* according to the embodiment.

Figure 13A:
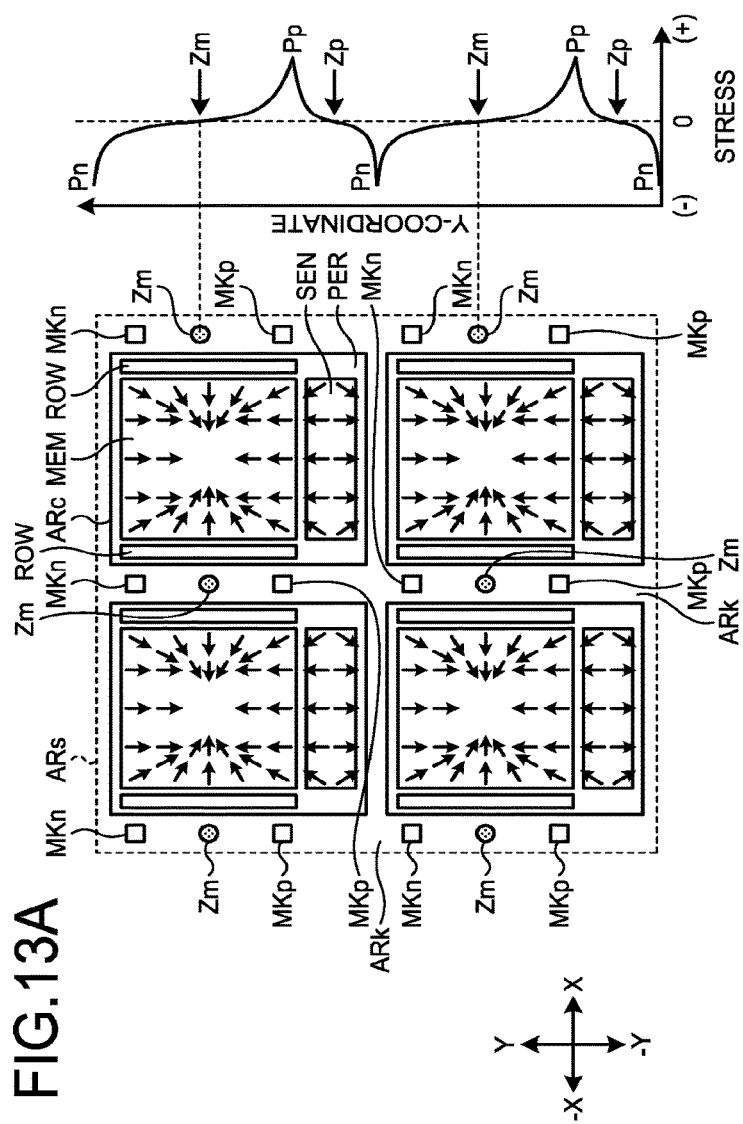
FIGS. 13A to 13D are schematic views for explaining a procedure for determining positions of arranging marks according to the embodiment.

As illustrated in FIG. 13A, the memory portion MEM, which is mainly formed of the stacked body LMs, has a compressive stress toward the center of the memory portion MEM. Meanwhile, the peripheral region PER on the −Y-direction side with respect to the memory portion MEM has a tensile stress from the center in the region to the outside. These stresses are considered to be caused by the stacked structures of the sacrificial layers NL and the insulating layers OL on one side and the insulating layer 50 having a large volume on the other side. That is, these stresses are caused by the difference in the materials used to form the memory portion MEM and the peripheral region PER.

The peripheral region PER is also disposed on the +X-direction side and the −X-direction side with respect to the memory portion MEM, but the insulating layer 50 occupies less volume compared to the peripheral region PER in the vicinity of the memory portion MEM on the −Y-direction side. Therefore, it can be considered that the stress distribution in the shot region ARs is not largely affected by the peripheral region PER on the +X-direction side and the −X-direction side.

The stress distribution along the Y-coordinate in the kerf region ARk is illustrated on the right side of FIG. 13A. The stress distribution in the kerf region ARk has a negative peak Pn on the side opposite to the peripheral region PER of the memory portion MEM at the position aligned with the memory portion MEM in the X-direction, and gets close to zero as approaching the center of the memory portion MEM. The stress distribution then approaches and reaches a reference point Zm at which the stress is zero at a position aligned with the center of the memory portion MEM in the X-direction. That is, the reference point Zm is a point at which the influence of stress becomes zero. From the reference point Zm aligned with the center of the memory portion MEM in the X-direction, the stress shifts from zero to the positive side as approaching the peripheral region PER of the memory portion MEM, and reaches a positive peak Pp at the end of the memory portion MEM.

Further, in the kerf region ARk at a position corresponding to the peripheral region PER where the sense amplifier SEN is disposed, the stress distribution has a positive peak Pp on the memory portion MEM side, and has a negative peak Pn on the side opposite to the memory portion MEM after passing a reference point Zp at which the influence of the stress is zero at the position aligned with the center of the peripheral region PER in the X-direction.

As described above, both the memory portion MEM and the peripheral region PER have the reference points Zm and Zp, respectively, at which the influence of stress becomes zero, on both sides of which in the Y-direction the regions having stresses in opposite directions are arranged.

To determine the positions of arranging the paired marks 40*n* and 40*p*, first, at least one reference point Zm or Zp is extracted. Then, two points on the kerf region ARk positioned across the extracted reference point Zm or reference point Zp and receiving stresses in opposite directions of the extracted reference point Zm or reference point Zp are extracted. At this time, two points where the difference between the absolute values of the applied stress is within a predetermined range are extracted so that the absolute values of these stresses are as equal as possible. There are more than one set of such two points that satisfy these conditions. Some examples are illustrated in FIGS. 13B to 13D.

Figures 13B, 13C, 13D:
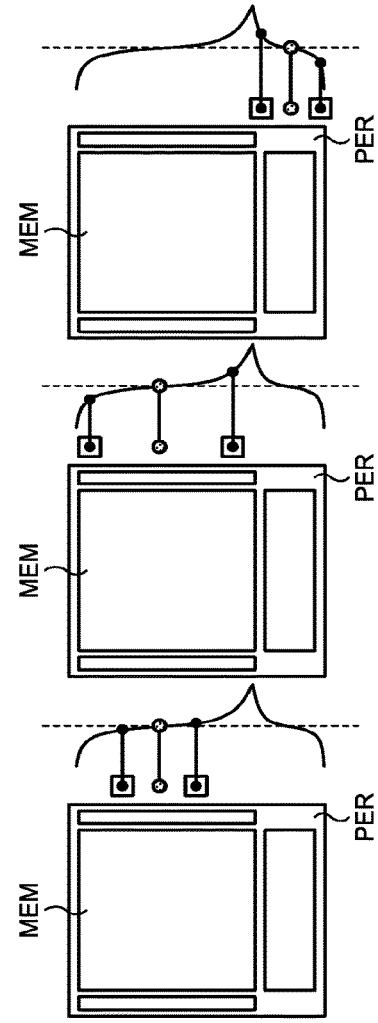

FIG. 13B illustrates two points located at positions across the reference point Zm are extracted, and the two points are relatively close to each other corresponding to the memory portion MEM in the kerf region ARk.

FIG. 13C illustrates two points located at positions across the reference point Zm are extracted, and the two points are relatively far from each other corresponding to both ends of the memory portion MEM in the kerf region ARk.

FIG. 13D illustrates two points located at positions across the reference point Zp, and the two points correspond to the peripheral region PER in the kerf region ARk.

In addition to the marks 40*n* and 40*p*, other marks and other components may be arranged in the kerf region ARk. Of the plurality of candidates satisfying the above conditions, two points where no other components are arranged can be arbitrarily selected. Then, the extracted two points are determined as the positions of the marks 40*n* and 40*p*. In the example of FIG. 13A, the positions illustrated in FIG. 13C are determined as the positions of the marks 40*n* and 40*p*.

Note that at least one pair of marks 40*n* and 40*p* can be arranged in the kerf region ARk located at the outer edge portion of the shot region ARs of the kerf region ARk that is arranged like a grid among the chip regions ARc. Preferably, the plurality of marks 40*n*, 40*p* may be arranged in the kerf region ARk at the outer edge portion of the shot region ARs. More preferably, as in the example of FIG. 13A, one or more pairs of marks 40*n* and 40*p* in addition may be arranged in the kerf region ARk near the center of the shot region ARs.

As described above, the positions of the marks 40*n* and 40*p* are determined, for example, before the manufacturing process of the semiconductor device 1 with the predetermined substrate SB starts. Once the positions of arranging the marks 40*n* and 40*p* are determined, the positions of arranging the marks LMKn and LMKp to be formed on the substrate SB are determined on the basis of the determination. That is, the positions of arranging the marks LMKn and LMKp are determined so as to be overlapped by the marks 40*n* and 40*p* in a top view.

Thereafter, the above-described manufacturing process of the semiconductor device 1 is performed according to the determined positions of the marks 40*n*, 40*p*, LMKn, and LMKp. When the manufacturing process of the semiconductor device 1 is performed up to the processing illustrated in FIGS. 5A to 5C and the resist pattern 40 including the marks 40*n* and 40*p* is formed in the kerf region ARk, the misalignment inspection is performed using the marks 40*n*, 40*p*, LMKn, and LMKp.

Figure 14A:
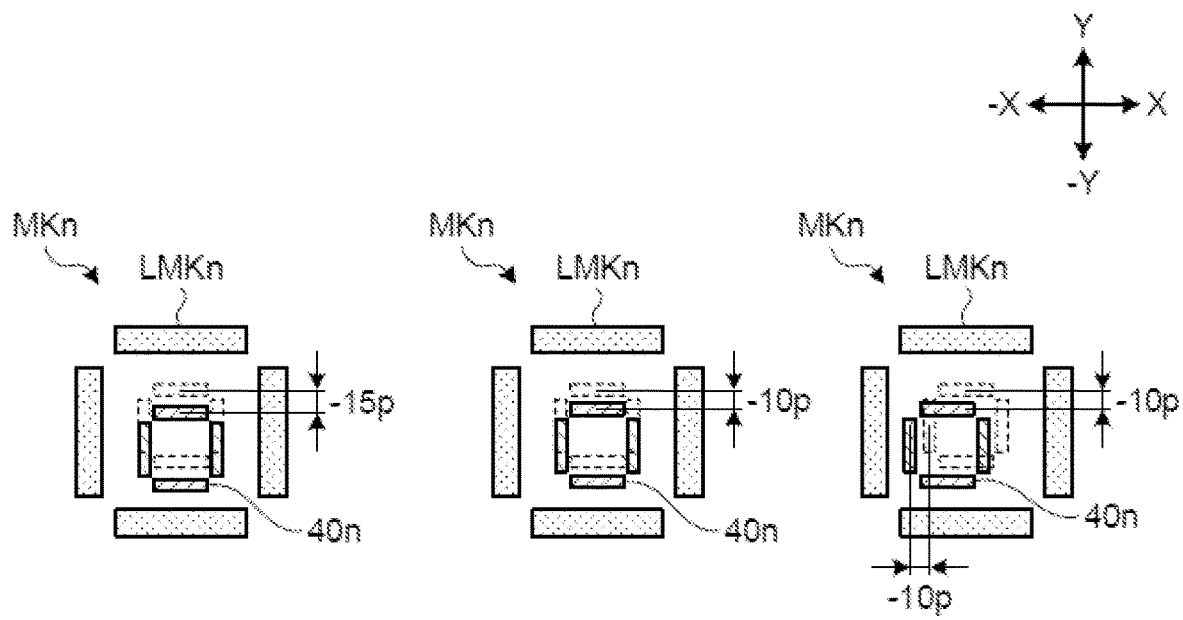
FIGS. 14A to 14C are schematic views for explaining a procedure of misalignment inspection using the marks according to the embodiment.
Figure 14B:
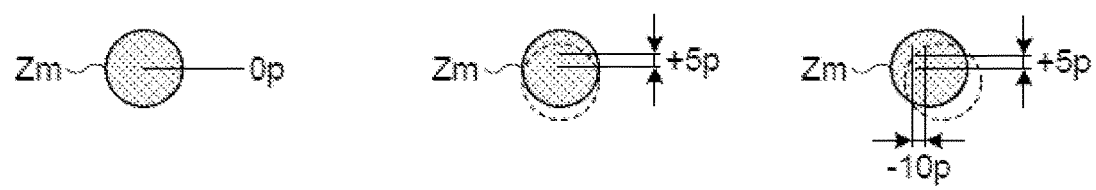
Figure 14C:
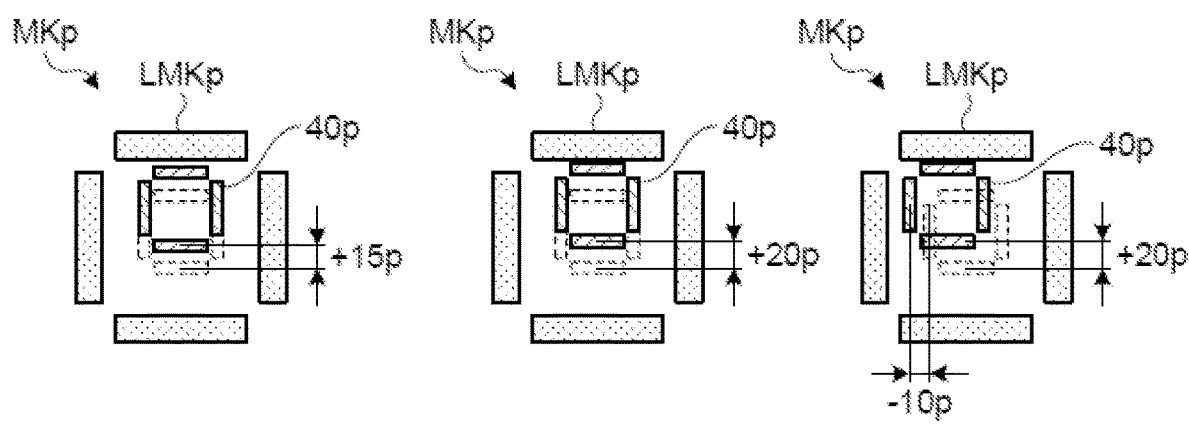

FIGS. 14A to 14C are schematic views for explaining a misalignment inspection procedure using the marks MKn and MKp according to the embodiment. FIG. 14A illustrates an example in which no misalignment exists. FIG. 14B illustrates an example in a case where the misalignment occurs in the Y-direction. FIG. 14C illustrates an example in a case where misalignment occurs in the X-direction and the Y-direction.

As illustrated in FIG. 14A, in the misalignment inspection, the marks 40n and LMKn are observed with an optical microscope or the like as overlapping marks MKn in a top view. The mark MKn is designed such that all opposing sides of the marks 40n and LMKn are located at equal intervals.

In the example of FIG. 14A, the mark 40n is moved by 15 points in the −Y-direction, that is, −15 points from the mark LMKn. However, this does not necessarily mean that the mark 40n is misaligned with respect to the hierarchical layer on which the mark LMKn is disposed. As described above, the mark 40n is disposed at a point to which a negative stress is applied, so that the position of the mark 40n may also be moved by predetermined points in the −Y-direction due to the stress strain.

In the misalignment inspection, the marks 40p and LMKp are also observed with the optical microscope or the like as the overlapping mark MKp in a top view. The mark MKp is also designed such that all opposing sides of the marks 40p and LMKp are located at equal intervals.

In the example of FIG. 14A, the mark 40p is moved from the mark LMKp by 15 points in the +Y-direction, that is, +15 points. Here, the mark 40p is located at a point to which a positive stress is applied, and the position of the mark 40p can move by a predetermined point in the +Y-direction due to the stress strain.

To obtain the actual misalignment amount of the marks 40n and 40p with respect to the hierarchical positions of the marks LMKn and LMKp by excluding the misalignment due to the stress strain between the marks 40n and LMKn and between the marks 40p and LMKp, an average value of the misalignment amount between the mark 40n and LMKn and the misalignment amount between the marks 40p and LMKp is calculated. This average value is a substantial misalignment amount excluding the misalignment due to the stress strain. That is, this average value can be regarded as a misalignment amount at the reference point Zm at which there is no influence of the stress.

Specifically, the misalignment amount at the reference point Zm is obtained by the following equation.

Misalignment amount at reference point $Zm$=(misalignment amount between marks 40$n$ and LMKn+misalignment amount between marks 40$p$ and LMKp)/2=(15+15)/2=0

As described above, in the example of FIG. 14A, the misalignment amount in the Y-direction at the reference point Zm is 0 points.

Meanwhile, in the X-direction, the kerf region ARk is arranged between the memory portions MEM and is considered to be hardly affected by the stress. This is because, in the X-direction, the memory portions MEM, which are the sources of the stress, are arranged in a line, so that the stresses can be offset between the memory portions MEM.

Ideally, assuming that the kerf region ARk receives substantially no influence from the stress in the X-direction, there is no misalignment in the X-direction so long as the opposing sides of the marks 40n and LMKn are located at equal intervals in the X-direction as illustrated in FIG. 14A.

In the example illustrated in FIG. 14B, the mark 40n is moved from the mark LMKn by 10 points in the −Y-direction, that is, −10 points. The mark 40p is moved by 20 points in the +Y-direction with respect to the mark LMKp, that is, +20 points. Similarly, as described above, the misalignment amount at the reference point Zm can be obtained by calculating the average value of the misalignment amount between the marks 40n and LMKn and the misalignment amount between the marks 40p and LMKp from these observation results.

Misalignment amount at the reference point $Zm$=(−10+20)/2=5

As described above, in the example of FIG. 14B, the misalignment amount in the Y-direction at the reference point Zm is +5 points.

Further, there is no misalignment in the X-direction in the example of FIG. 14B, similarly to the example of FIG. 14A.

In the example illustrated in FIG. 14C, the mark 40n is moved by 10 points, that is, −10 points in the −Y-direction with respect to the mark LMKn. The mark 40p is moved by 20 points in the +Y-direction with respect to the mark LMKp, that is, +20 points. Therefore, the misalignment amount in the Y-direction at the reference point Zm is +5 points.

Further, the mark 40n is moved by 10 points in the −X-direction, that is, −10 points with respect to the mark LMKn in the example of FIG. 14C. Therefore, the misalignment amount in the X-direction at the mark MKn position is −10 points. The mark 40p is moved by 10 points in the −X-direction, that is, −10 points from the mark LMKp. Therefore, the misalignment amount in the X-direction at the mark MKp position is −10 points.

As illustrated in FIGS. 14B and 14C, when the misalignment amount in at least one of the X-direction and the Y-direction exceeds a predetermined value, the resist pattern 40 is stripped off and, for example, the resist pattern 40 is repeatedly formed until the misalignment amount is not exceeding the predetermined value as illustrated in FIG. 14A.

By setting the misalignment amount between the marks 40n and 40p of the resist pattern 40 and the marks LMKn and LMKp of the substrate SB to an amount not exceeding a predetermined value, it is possible to align the positional relationship between the memory hole MH formed using the resist pattern 40 and the transistor TR and the like in the peripheral circuit at an accuracy within tolerance.

(Example of Method for Arranging Marks)

Figure 15:
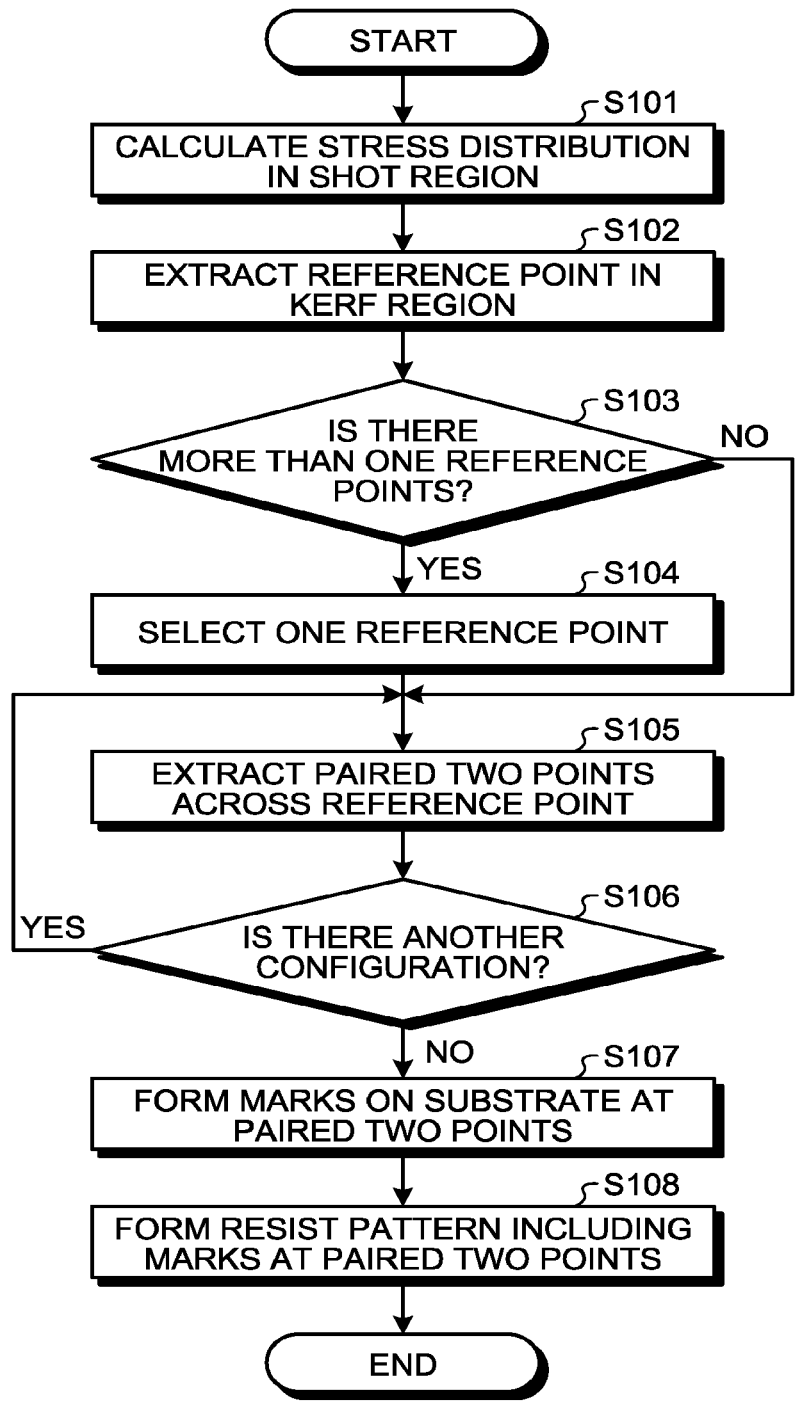
FIG. 15 is a flowchart illustrating an example procedure of the mark arrangement method according to the embodiment.

Next, an example of a method for arranging the marks MKn and MKp according to the embodiment is described with reference to FIG. 15. FIG. 15 is a flowchart illustrating an example procedure of a method for arranging the marks MKn and MKp according to the embodiment. The method for arranging the marks MKn and MKp in the embodiment is performed as part of the method for manufacturing the semiconductor device 1 in the embodiment.

As illustrated in FIG. 15, for example, the strain amount on the surface of each portion in the shot region ARs is measured, and the stress distribution is calculated from the strain amount (Step S101).

On the basis of the calculated stress distribution, a reference point Zm in the kerf region ARk is extracted (Step S102). At this time, the reference point Zm is extracted here, although the reference point Zp may be extracted in addition to or instead of the reference point Zm.

It is determined whether there is more than one extracted reference points Zm (Step S103). If there is more than one reference points Zm (Step S103: Yes), one reference point Zm is selected (Step S104). If there is only one reference point Zm (Step S103: No), the process proceeds to Step S105.

Two points that form a pair across the reference point Zm are extracted (Step S105). Here, the two points that form a pair are points that have stresses in opposite directions and to which such a stress that the difference between the absolute values of the stresses falls within a predetermined range is applied.

It is confirmed whether another configuration exists at the two extracted points (Step S106). If another configuration exists (Step S106: Yes), the two points that form a pair are extracted again (Step S105). If no other configuration exists (Step S106: No), the process proceeds to Step S107.

Marks LMKn and LMKp are formed at positions of the paired two points on the surface layer of the substrates SB (Step S107). Marks 40n and 40p are arranged later at the paired two points. The marks LMKn and LMKp are formed at positions that is overlapped by the marks 40n and 40p in a top view. Thus, the marks LMKn and LMKp are arranged on the same hierarchical layer as the hierarchical layer on which the row decoder ROW and the transistor TR of the sense amplifier SEN are formed.

A resist pattern having the marks 40n and 40p at two paired points is formed on the insulating layer 50 (Step S108). Thus, the marks 40n and 40p are arranged above the hierarchical layer where the stacked body LMs and the pillar PL are formed.

As described above, the marks MKn and MKp of the embodiment are arranged.

(Example of Misalignment Inspection Method)

Figure 16:
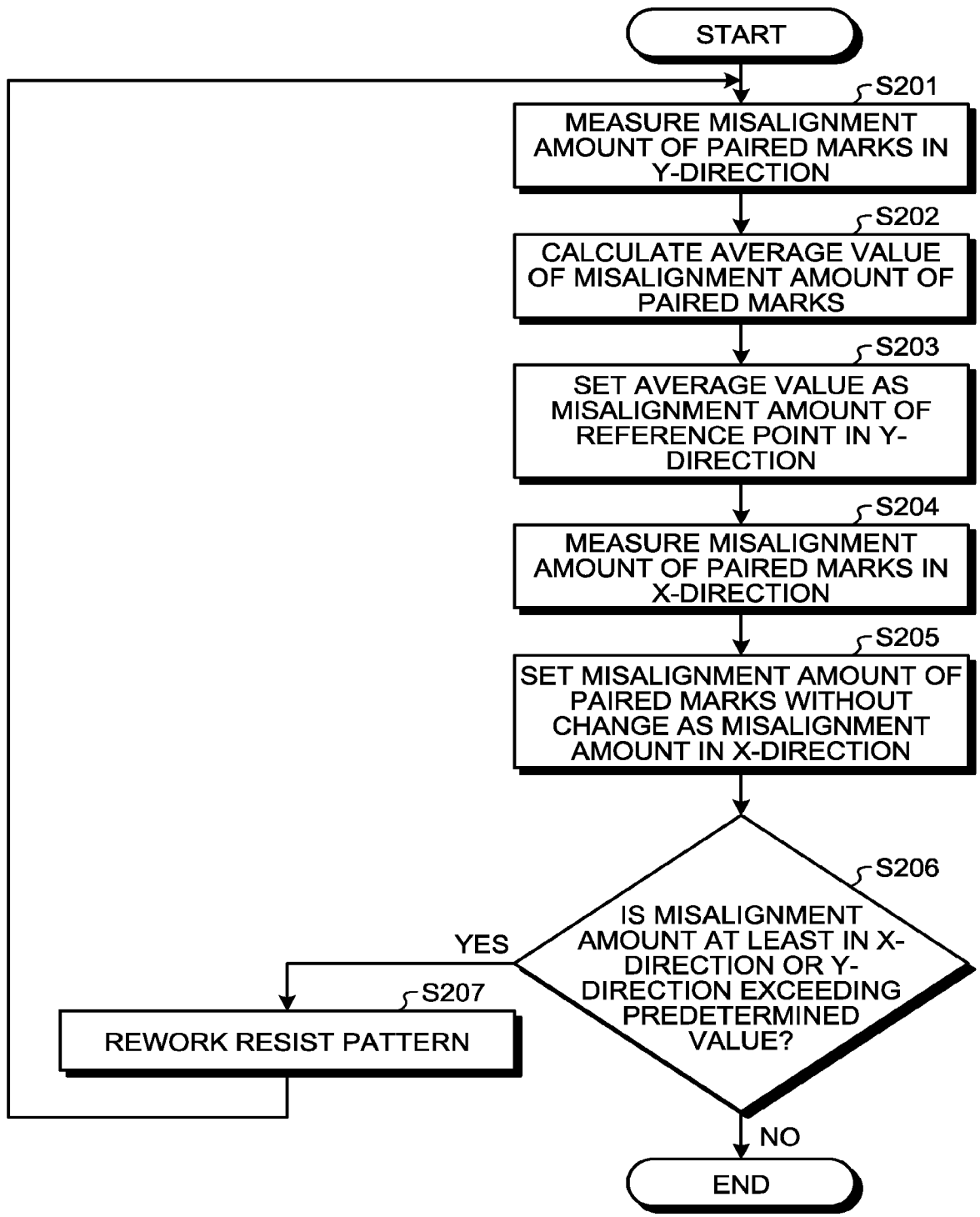
FIG. 16 is a flowchart illustrating an example procedure of a misalignment inspection method using marks according to the embodiment.

Next, an example of a misalignment inspection method using the marks MKn and MKp of the embodiment is described with reference to FIG. 16. FIG. 16 is a flowchart illustrating an example procedure of the misalignment inspection method using the marks MKn and MKp according to the embodiment. The misalignment inspection method using the marks MKn and MKp of the embodiment is performed as part of the method for manufacturing the semiconductor device 1 of the embodiment.

As illustrated in FIG. 16, the misalignment amount in the Y-direction of the paired marks 40n and 40p with respect to the marks LMKn and LMKp is measured (Step S201).

An average value of misalignment amounts of the paired marks 40n and 40p is calculated (Step S202).

The calculated average value is set as the misalignment amount of the reference point Zm in the Y-direction between the marks 40n and 40p (Step S203).

The misalignment amounts of the paired marks 40n and 40p in the X-direction with respect to the marks LMKn and LMKp are measured (Step S204).

The misalignment amount of the mark 40n from the mark LMKn is set as the misalignment amount at the position of the mark MKn in the X-direction. The misalignment amount of the mark 40p from the mark LMKp is set as the misalignment amount at the position of the mark MKp in the X-direction (Step S205).

It is determined whether at least one of the misalignment amounts in the X-direction and the misalignment amount in the Y-direction exceeds a predetermined value (Step S206). If any one of the misalignment amounts exceeds a predetermined value (Step S206: Yes), reworking of the resist pattern 40 is performed (Step S207). Then, the processing from Step S201 is repeated. If any misalignment amount is equal to or less than the predetermined value (Step S206: No), the process ends.

As described above, the misalignment inspection using the marks MKn and MKp of the embodiment is completed. Note that the processing in Steps S201 to S203 and the processing in Steps S204 to S205 can be interchanged. Alternatively, the processing of Steps S201 to S203 and the processing of Steps S204 to S205 may be performed in parallel.

The result of the misalignment inspection is referenced when the resist pattern 40 is reworked. Further, the result may be referenced for a substrate SB, a production lot, or the like, to be processed later.

In the manufacturing process of a semiconductor device, when a pattern or the like is formed on an upper layer, the resist pattern formed on the upper layer for pattern formation is inspected in advance for any misalignment with respect to the lower layer. The misalignment mark in the resist pattern is used for such misalignment inspection. However, if the stress is generated in the upper layer, the position of the misalignment mark may be moved due to the stress strain, and the misalignment inspection cannot be performed with high accuracy.

The misalignment due to the stress strain can be avoided by arranging the misalignment mark at a point where there is no influence of stress in the shot region, for example, the position in the kerf region that is aligned in the X-direction at the center position of the memory portion in the Y-direction. However, various configurations including a plurality of marks are arranged in the kerf region, so that it is not always possible to arrange misalignment marks at the ideal points as described above.

According to the method for manufacturing the semiconductor device 1 of the embodiment, the paired marks 40n and 40p are arranged at the two points where the stresses acting in the opposite directions are applied and the difference between the absolute values of the stresses is within the predetermined range across the reference point Zm that is not affected by the stress. Accordingly, the marks 40n and 40p capable of improving the accuracy of the misalignment inspection between the hierarchical layers are obtained. Further, there is more than one pair of the two points satisfying the above conditions, thus increasing the degree of freedom of arrangement of the marks 40n and 40p.

According to the method for manufacturing the semiconductor device 1 of the embodiment, the average value of the misalignment amounts in the stress direction of the paired marks 40n and 40p is set as the misalignment amount in the stress direction at the reference point Zm. Thus, it is possible to cancel the misalignment of the marks 40n and 40p due to the stress strain and extract a substantial misalignment amount.

In the above-described embodiment, it is assumed that the kerf region ARk in which the marks MKn and MKp are arranged is not affected by the stress in the X-direction. However, when the stress in the X-direction is applied to the kerf region, the configuration of the embodiment can also be applied in the X-direction. That is, the misalignment marks may be arranged at two points arranged in the X-direction across a reference point that is not affected by stress.

Further, the shapes of the marks LUn, LUp, MKn, MKp, and the like illustrated in the above-described embodiment are merely examples, and the marks may have other shapes. For example, marks having various shapes such as a box-in-box, a bar-in-bar, a grid type, and the like can be used. However, it is preferable that the paired marks MKn, MKp, and the like are the same type of marks.

(First Modification)

Figure 17:
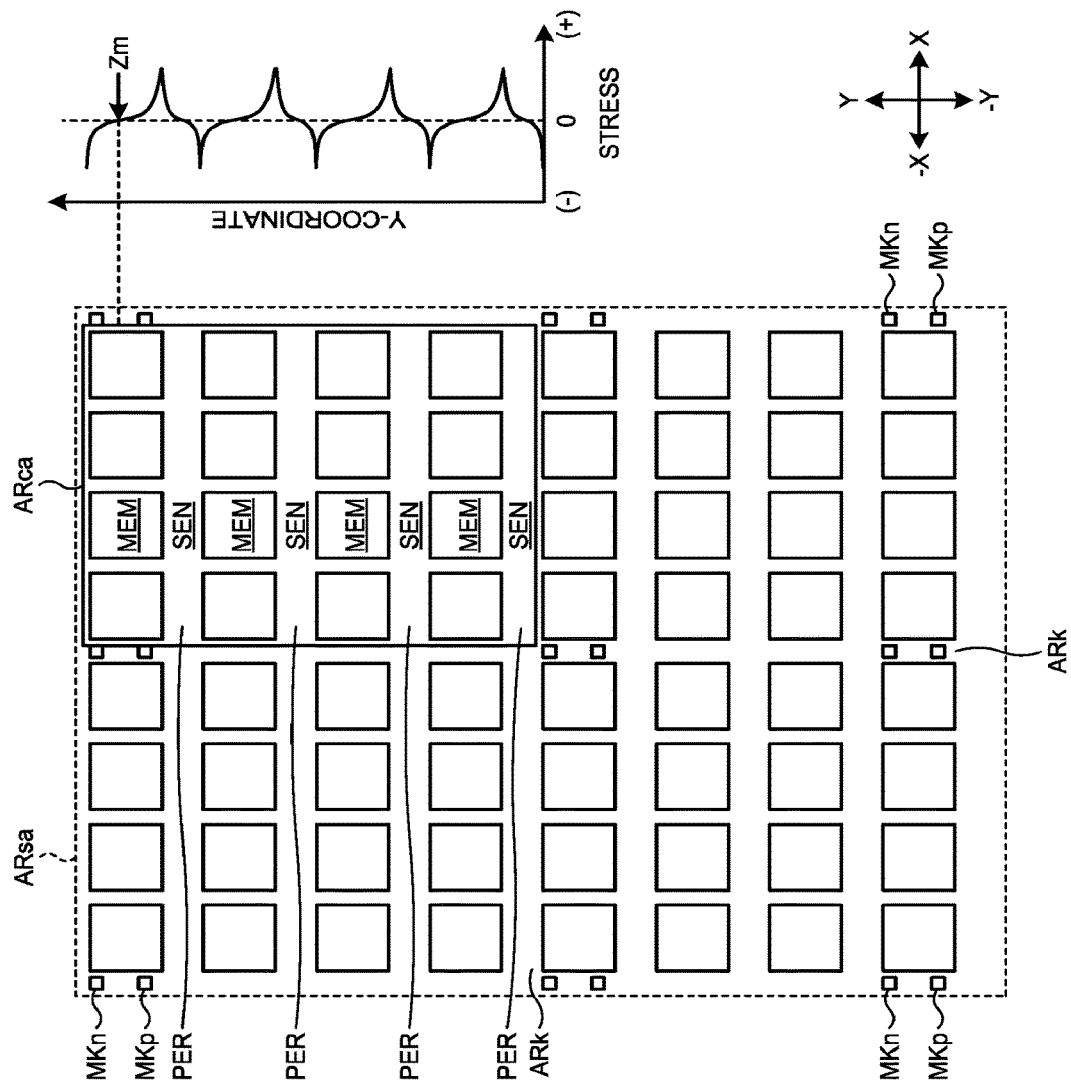
FIG. 17 is a schematic diagram illustrating an example of the arrangement of marks according to a first modification of the embodiment.

Next, the configuration of a first modification of the embodiment is described with reference to FIG. 17. FIG. 17 is a schematic diagram illustrating an example of an arrangement of marks MKn and MKp according to the first modification of the embodiment. In the configuration of the first modification, the number of memory portions MEM and the like included in one chip region ARca is different from that in the above-described embodiment.

As illustrated in FIG. 17, the shot region ARsa of the semiconductor device of the first modification also includes a plurality of chip regions ARca, as in the above-described embodiment. However, a plurality of memory portions MEM is arranged in one chip region ARca. The configuration of the peripheral circuit associated with each memory portion MEM is the same as that of the embodiment. That is, the sense amplifier SEN is arranged in the −Y-direction for one memory portion MEM, and row decoders (not illustrated) are arranged on both sides in the X-direction. As a result, the memory cells of the individual memory portions MEM can process in parallel.

In such a configuration, a memory region is mainly configured by the plurality of memory portions MEM included in the chip region ARca, unlike the above-described embodiment. Each memory portion MEM can be regarded as a memory sub-region. The memory sub-regions are arranged along the direction in which the kerf region ARk extends, that is, in the X-direction and the Y-direction, and each region includes memory cells that can process in parallel. Thus, in the configuration of the first modification, the memory region has a plurality of memory sub-regions.

In the configuration of the above-described embodiment, only one memory portion MEM, for example, included in the chip region ARc may be considered as a memory region and a memory sub-region.

As illustrated on the right side of one chip region ARca in FIG. 17, even in such a configuration, the stress distribution in the kerf region ARk is a repetition of the stress distribution similar to that in the embodiment, and the paired marks MKn and MKp can be arranged at the same positions as in the embodiment.

That is, in the first modification, at least one pair of the marks MKn and MKp can be arranged in the kerf region ARk arranged at the outer edge portion of the shot region ARsa. Preferably, the plurality of pared marks MKn and MKp may be arranged in the kerf region ARk at the outer edge portion of the shot region ARsa. More preferably, as in the example of FIG. 17, one or more paired marks MKn and MKp in addition may be arranged in the kerf region ARk near the center of the shot region ARsa. The plurality of paired marks MKn and MKp may further be provided as the size of the entire shot region ARsa increases along with the increase in the number of the memory portions MEM in the chip region ARca.

(Second Modification)

Figure 18:
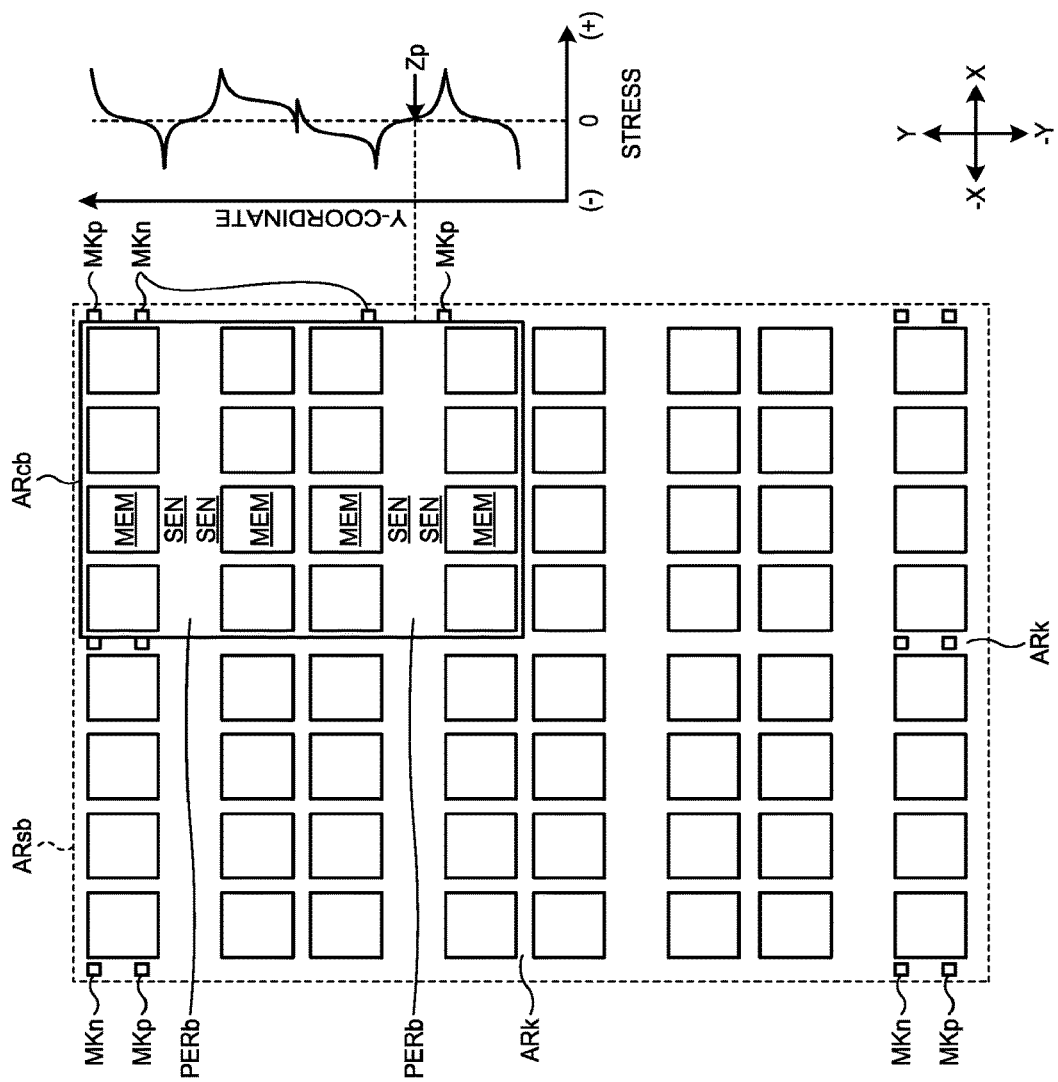
FIG. 18 is a schematic diagram illustrating an example of the arrangement of marks according to a second modification of the embodiment.

Next, the configuration of a shot region ARsb of a second modification of the embodiment is described with reference to FIG. 18. FIG. 18 is a schematic diagram illustrating an example arrangement of marks MKn and MKp according to the second modification of the embodiment. In the configuration of the second modification, the arrangement of the memory portions MEM in the chip region ARcb is different from the first modification described above.

As illustrated in FIG. 18, the chip region ARcb of the semiconductor device of the second modification also includes the plurality of memory portions MEM and their associated peripheral circuits, as in the first modification described above. Therefore, as in the first modification described above, the memory cells included in each memory portion MEM can process in parallel. That is, the memory region also includes the plurality of memory sub-regions in the configuration of the second modification. However, the sense amplifiers SEN are alternately arranged in the +Y-direction and the −Y-direction with respect to the corresponding memory portions MEM. However, row decoders (not illustrated) are arranged on both sides in the X-direction with respect to each memory portion MEM.

Accordingly, as illustrated on the right side of one chip region ARcb in FIG. 18, the stress distribution in the kerf region ARk slightly deviates from the regular distribution in which a negative peak and a positive peak are alternately repeated.

Specifically, the two memory portions MEM are arranged close to each other in the center portion of the chip region ARcb in the Y-direction. As a result, in the kerf region ARk corresponding to these two memory portions MEM, the stress distribution includes a small negative peak on the +Y-direction side, and includes a small positive peak between the memory portions MEM, while proceeding to a positive peak on the −Y-direction side. Further, the stress changes from a negative stress to a positive stress by drawing a steep plot line. For this reason, it is difficult to set a reference point at a position corresponding to two adjacent memory portions MEM.

Therefore, for example, the reference point Zp may be set at the center portion in the Y-direction of the peripheral region PERb between the memory portion MEM at the end in the −Y-direction and the memory portion MEM adjacent to the memory portion MEM in the +Y-direction. The marks MKn and MKp may be arranged on both sides in the Y-direction across the reference point Zp. In this case, the mark MKp is arranged at the +Y-direction end of the memory portion MEM at the end in the −Y-direction, while the mark MKn is arranged at the −Y-direction end of the memory portion MEM adjacent to the memory portion MEM in the +Y-direction. That is, the paired marks MKn and MKp are arranged so as to be close to the two memory portions MEM, respectively.

Thus, the paired marks MKn and MKp are each arranged in the vicinity of two adjacent memory portions MEM, and may be arranged at positions that are, for example, line-symmetric in the Y-direction with respect to the center position between the memory portions MEM that separate the memory portions MEM. This also makes it possible to identify the paired marks MKn and MKp from among the plurality of marks MKn and MKp.

In the above-described embodiment and the first and second modifications, the description has been given by taking the three-dimensional nonvolatile memory as an example, but the semiconductor device to which the configuration of the embodiment and the like are applicable is not limited thereto. The configuration of the embodiment and the like can be applied to a semiconductor device having a plurality of hierarchical layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a plurality of chip regions, each including a memory region in which a plurality of memory cells is arranged; and
   a kerf region disposed between the chip regions and surrounding each chip region, wherein
   paired marks are arranged in a vicinity of the memory region of one chip region of the plurality of chip regions and each pair of marks is arranged in a common hierarchical layer in the kerf region, the paired marks being disposed over upper and lower hierarchical layers,
   the memory region includes a plurality of memory sub-regions arranged in a first direction, the kerf region where a first pair of marks among the paired marks is arranged extending in the first direction, and
   the first pair of marks is arranged to be close to a first memory sub-region of the memory sub-regions, the first pair of marks being arranged close to positions symmetric each other of the first memory sub-region with respect to the first direction.

2. The semiconductor device according to claim 1, wherein
   the chip regions each include a peripheral region where a peripheral circuit is disposed, and
   the memory sub-regions are arranged along with the peripheral region in the first direction.

3. The semiconductor device according to claim 2, wherein
   a hierarchical layer of the memory region on which the plurality of memory cells is arranged in the memory region and a hierarchical layer of the peripheral region identical to the hierarchical layer on which the plurality of memory cells is arranged in the memory region are at least partly made of different materials.

4. The semiconductor device according to claim 3, wherein
   the hierarchical layer on which the plurality of memory cells is arranged in the memory region is in a stacked structure in which a plurality of conductive layers and a plurality of first insulating layers are alternately disposed.

5. The semiconductor device according to claim 4, wherein
   a second insulating layer of which a thickness reaches at least a height of a top surface of the stacked structure is disposed in the peripheral region on the hierarchical layer identical to the hierarchical layer on which the plurality of memory cells is arranged in the memory region.

6. The semiconductor device according to claim 2, wherein
   a second pair of marks among the paired marks is arranged to be close to two memory sub-regions separately, the two memory sub-regions being adjacent to each other via the peripheral region with respect to the first direction.

7. The semiconductor device according to claim 1, wherein
   the paired marks arranged in the common hierarchical layer are in a same type of a shape.

8. The semiconductor device according to claim 1, wherein
   an either of upper or lower paired marks of the paired marks disposed over the upper and lower hierarchical layers, is arranged on a hierarchical layer identical to a hierarchical layer of the memory region on which the plurality of memory cells is arranged in the memory region.

9. The semiconductor device according to claim 1, wherein
   the paired marks are disposed over the upper and lower hierarchical layers in a manner that at least part of the paired marks overlap between the upper and lower hierarchical layers.

10. The semiconductor device according to claim 9, wherein
    each of the paired marks is in a shape capable of measuring a misalignment amount.

11. The semiconductor device according to claim 9, wherein
    each of the paired marks forms at least in a shape of a box-in-box, a bar-in-bar, or a grid-type mark.

12. The semiconductor device according to claim 1, wherein
    the kerf region is not disposed in an inner area of each chip region.

13. A method for manufacturing a semiconductor device including a plurality of hierarchical layers, comprising:
    forming first marks on a lower hierarchical layer at positions corresponding to a first point and a second point respectively;
    forming a mask pattern including second marks above an upper hierarchical layer at positions corresponding to the first position and the second position respectively, the first point and the second point being located at an outer edge portion of a shot region subjected to one-time exposure, the first point and the second point being applied with stresses in opposite directions respectively in the upper hierarchical layer, and the first point and the second point being positioned across a reference point where no influence of stress exists in the upper hierarchical layer;
    measuring a first misalignment amount between one of the first marks and one of the second marks at the first point and a second misalignment amount between another of the first marks and another of the second marks at the second point, the first and second misalignment amounts being measured in a first direction in which the reference point, the first point, and the second point are arranged;
    calculating an average value of the first misalignment amount at the first point and the second misalignment amount at the second point; and
    setting the average value as a third misalignment amount at the reference point.

14. The method for manufacturing the semiconductor device according to claim 13, wherein
    the reference point, the first point, and the second point are extracted in accordance with a measured strain amount of the shot region in the upper hierarchical layer or simulated stress of the shot region in the upper hierarchical layer.

15. The method for manufacturing the semiconductor device according to claim 13, wherein
    the upper hierarchical layer includes a first region and a second region made of different constituent materials.

16. The method for manufacturing the semiconductor device according to claim 15, wherein
a stacked structure is formed in the first region.

17. The method for manufacturing the semiconductor device according to claim 16, wherein
the mask pattern has a pattern for processing at least the stacked structure in the first region.

18. The method for manufacturing the semiconductor device according to claim 16, wherein
the stacked structure is removed in the second region and an insulating layer of which a thickness reaches at least a height of a top surface of the stacked structure in the first region is formed in the second region.

19. A semiconductor device, comprising:
a plurality of chip regions, each including a memory region in which a plurality of memory cells is arranged; and
a kerf region disposed between the chip regions and surrounding each chip region, wherein
paired marks are arranged in a vicinity of the memory region of one chip region of the plurality of chip regions and each pair of marks is arranged in a common hierarchical layer in the kerf region, the paired marks being disposed over upper and lower hierarchical layers, the chip regions each include a peripheral region where a peripheral circuit is disposed, the memory region includes a plurality of memory sub-regions arranged along with the peripheral region in a first direction, the kerf region where the paired marks are arranged extending in the first direction, and the paired marks are arranged to be close to two memory sub-regions respectively, the two memory sub-regions being adjacent to each other via the peripheral region with respect to the first direction.

* * * * *